(12) United States Patent  (10) Patent No.: US 8,065,573 B2
Abts et al.  (45) Date of Patent: Nov. 22, 2011

(54) METHOD AND APPARATUS FOR TRACKING, REPORTING AND CORRECTING SINGLE-BIT MEMORY ERRORS

(75) Inventors: Dennis C. Abts, Eleva, WI (US); Gerald A Schwoerer, Chippwa Falls, WI (US); Van L. Snyder, Blaine, MN (US)

(73) Assignee: Cray Inc., Seattle, WA (US)

( * ) Notice: Subject to any disclaimer, the term of this patent is extended or adjusted under 35 U.S.C. 154(b) by 223 days.

(21) Appl. No.: 12/274,044

(22) Filed: Nov. 19, 2008

(65) Prior Publication Data

US 2009/0177932 A1  Jul. 9, 2009

Related U.S. Application Data

(63) Continuation-in-part of application No. 11/693,572, filed on Mar. 29, 2007.

(60) Provisional application No. 60/908,154, filed on Mar. 26, 2007.

(51) Int. Cl.
*G11C 29/00* (2006.01)

(52) U.S. Cl. ......... 714/723; 714/704; 714/711; 365/200

(58) Field of Classification Search ................... None
See application file for complete search history.

(56) References Cited

U.S. PATENT DOCUMENTS

| | | | | |
|---|---|---|---|---|
| 4,479,214 A * | 10/1984 | Ryan | | 714/702 |
| 4,535,455 A | 8/1985 | Peterson | | |
| 4,931,870 A * | 6/1990 | den Hollander | | 348/468 |
| 5,233,614 A * | 8/1993 | Singh | | 714/723 |
| 5,267,242 A * | 11/1993 | Lavallee et al. | | 714/7 |
| 5,535,220 A * | 7/1996 | Kanno et al. | | 714/701 |
| 5,798,670 A * | 8/1998 | Lee | | 327/552 |
| 6,513,135 B2 | 1/2003 | Harada | | |
| 6,845,472 B2 | 1/2005 | Walker et al. | | |
| 7,003,704 B2 * | 2/2006 | Adams et al. | | 714/711 |
| 7,082,453 B1 * | 7/2006 | Shackleford et al. | | 708/672 |
| 7,185,246 B2 | 2/2007 | Cochran et al. | | |
| 7,283,926 B2 * | 10/2007 | Wu | | 702/159 |
| 7,415,640 B1 * | 8/2008 | Zorian et al. | | 714/711 |
| 7,467,337 B2 * | 12/2008 | Nakamura et al. | | 714/704 |
| 2003/0088805 A1 | 5/2003 | Majni et al. | | |
| 2006/0184832 A1 * | 8/2006 | Floyd et al. | | 714/45 |
| 2009/0287889 A1 | 11/2009 | Abts et al. | | |
| 2010/0185897 A1 | 7/2010 | Abts et al. | | |

OTHER PUBLICATIONS

"U.S. Appl. No. 11/693,572, Non Final Office Action mailed Mar. 2, 2011", 26 pgs.

* cited by examiner

*Primary Examiner* — Jeffrey A Gaffin
*Assistant Examiner* — Steve Nguyen
(74) *Attorney, Agent, or Firm* — Schwegman, Lundberg & Woessner, P.A.

(57) ABSTRACT

Various embodiments include an apparatus comprising a memory device including a plurality of addressable memory locations, and a memory manager coupled to the memory device, the memory manager including a scheduling unit and a histogram data structure including a plurality of counters, the scheduling unit operable to detect a single-bit error in data read from the memory device, and to increment a value in a particular one of the plurality of counters, the particular one of the plurality of counters corresponding to the particular bit in the accessed data which incurred the single-bit error in the read data.

13 Claims, 11 Drawing Sheets

METHOD AND APPARATUS FOR TRACKING, REPORTING AND CORRECTING SINGLE-BIT MEMORY ERRORS

CROSS-REFERENCE TO RELATED APPLICATIONS

This application is a continuation-in-part of U.S. application Ser. No. 11/693,572 filed Mar. 29, 2007, which claims the benefit of U.S. Provisional Application Ser. No. 60/908,154 filed Mar. 26, 2007; which applications are incorporate herein by reference and made a part hereof.

FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA904-02-3-0052, awarded by the Maryland Procurement Office.

FIELD OF THE INVENTION

The invention relates generally to computer system memory, and more specifically, to a memory manager that is operable in bit error detection and correction modes.

BACKGROUND

A wide variety of computerized systems, from the smallest personal digital assistants to the most powerful supercomputers, use memory to store programs for fast execution, and to store data for rapid access while the computer system is operating. Volatile memory, such as the dynamic random access memory (DRAM) most commonly found in personal computers, is able to store data such that it can be read or written much more quickly than the same data could be accessed using nonvolatile storage such as a hard disk drive or flash nonvolatile memory. Volatile memory loses its content when power is cut off, so while it is generally not useful for long-term storage, it is generally used for temporary storage of data while a computer is running.

A typical random-access memory consists of an array of transistors or switches coupled to capacitors, where the transistors are used to switch a capacitor into or out of a circuit for reading or writing a value stored in the capacitive element. These storage bits are typically arranged in an array of rows and columns, and are accessed by specifying a memory address that contains or is decoded to find the row and column of the memory bit to be accessed.

The memory in a computer usually takes the form of a network of such circuit elements formed on an integrated circuit, or chip. Several integrated circuits are typically mounted to a single small printed circuit board to form a memory module, such as single inline memory modules (SIMMs) having a 32-bit memory channel for reading and writing data, or dual inline memory modules (DIMMs) having a 64-bit memory channel. Some more sophisticated types of memory modules include synchronous dynamic random access memory, or SDRAM, which runs in synchronization with the computer's bus, and double data rate (DDR) SDRAM or DDR2 SDRAM, which transfer data on both the rising and falling edges of the clock and have memory channel widths up to 64 bits of data and 8 bits of error management information per memory transfer. DDR2 SDRAM is a random access memory technology used for high speed storage of the working data of a computer or other digital electronic device.

Improvements in memory technology over time include making memory chips smaller, faster, and operable to consume less power, and therefore to generate less heat. But, the constant push to improve memory performance and the imperfect nature of manufactured goods in general suggest that occasional flaws or imperfections will occur. Individual memory bit storage locations occasionally go bad, and sometimes even whole memory chips fail. It is also known that various electrical phenomena can regularly cause memory read or write errors, such as electromagnetic noise causing a signal level to change, or a cosmic ray changing the state of one or more bits of memory. Reductions in the size of memory elements and reductions in the voltage used to operate the memory make such problems increasingly important to consider when designing memory.

Error management is therefore implemented in many memory systems, and is most typically embodied in a single parity bit per data byte that is operable to indicate when a single bit has changed state, or error correction codes (ECC) that can detect and often correct single-bit errors in memory systems. Even though the reliability of individual memory components is very high, the number of memory components in large computer systems and the costs involved with producing the amount of memory needed makes memory error detection and correction an important consideration in memory system design.

DETAILED DESCRIPTION

Figure 1:
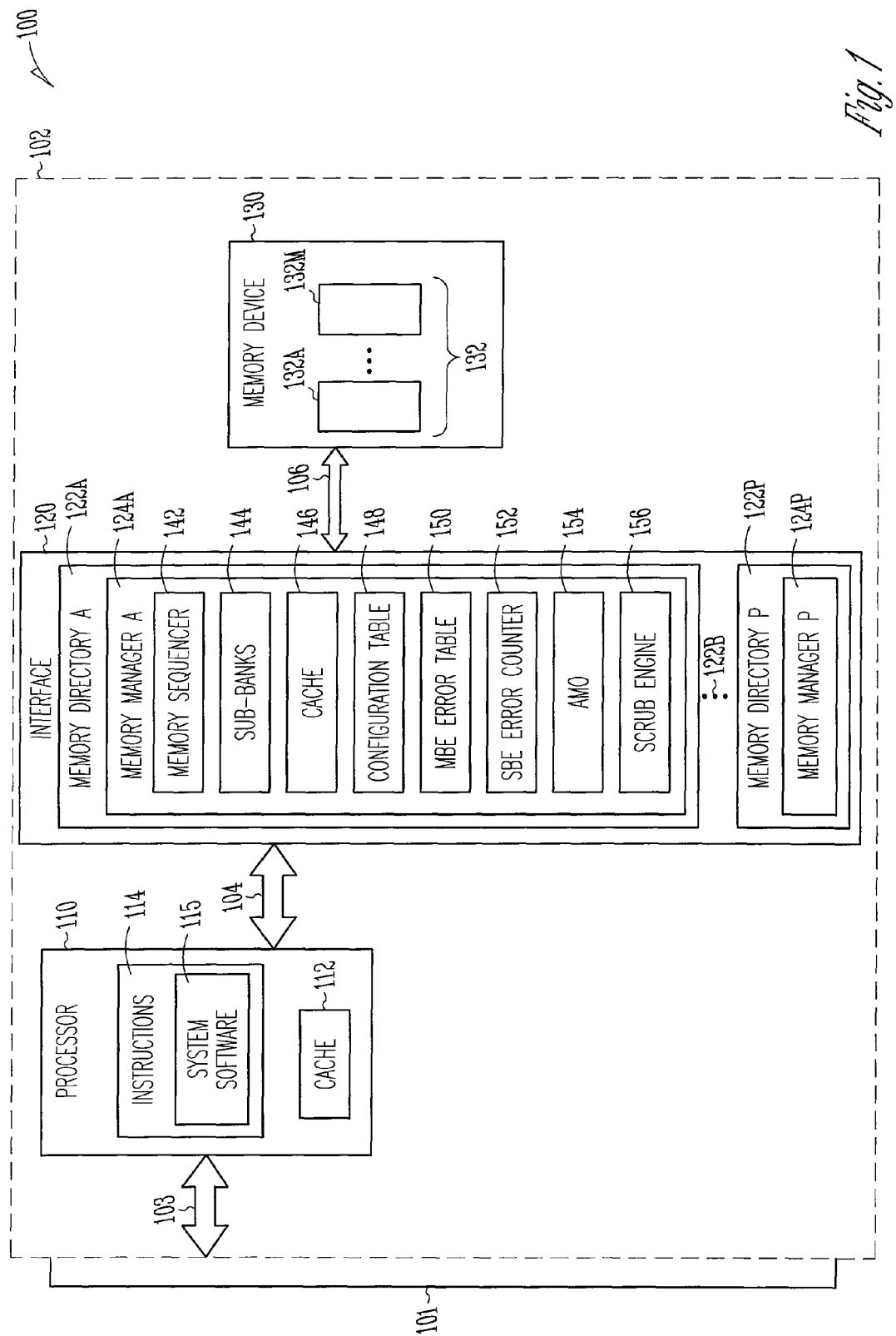
FIG. 1 shows a functional block diagram of an illustrative system including a processor, an interface, and a memory device.

Modern DRAM devices are built from high-density, low-voltage integrated circuits that are becoming increasingly susceptible to influences from external factors such as electrical noise, process variation, and natural radiation (particle-induced upsets). The resultant errors from these effects are referred to as "soft errors" since they can corrupt the state of a storage element, but generally do not cause any permanent damage to the underlying circuitry. The rate at which these events occur is referred to as the soft error rate (SER), and has been steadily increasing as transistor geometries shrink.

A variety of error mitigation techniques are applied to reduce the impact that soft errors have on a system composed of thousands of high-density memory devices. Error correction codes (ECC), such as single error correction with double error detection (SECDED), will tolerate a single "bit flip" event, but will fail if multiple bits within the protected region (the bits over which the ECC is protecting) are flipped. The increasing density and smaller transistor cross section is expected to make multi-bit upsets more common in the future. A memory reference (read) to a location with a multi-bit error (MBE) will, in many instances, cause the application requesting the memory reference to fail.

Error mitigation techniques, such as ECC codes, SECDED codes, chip-kill, and other modified Hamming codes are designed to correct single-bit errors. It is possible to extend these techniques to allow multiple adjacent memory bits to be corrected, however, this approach is more expensive (requiring additional check bits) and only applies to soft errors that are clustered (effecting multiple adjacent bits within the word).

These and other problems, including the growing problem of soft errors in DRAM memory devices, are addresses by the various apparatus, methods, and systems described herein. Various embodiments include apparatus, methods, and systems including a retry mechanism providing retry operations for memory read operations. The retry operations are utilized to provide multiple attempts to read data from a memory device, and to disambiguate a MBE soft error that caused multi "bit flips" in a memory devices from a MBE soft error induced by electrical (simultaneous switching) noise, operating temperature variance, or marginal electrical signaling. Further, it is possible for combinations of errors to simultaneously exist within data read from a given memory location, which gives the appearance of a single event with multi-bit errors. By way of illustration, a single "bit flip" event in main memory, combined with the electrical noise on the memory interface pins, can result in a soft error that contain a MBE error in read data. By retrying the faulty memory read operation, the retry hardware associated with the retry mechanism can distinguish between an intermittent error that may not appear on a read during a re-reading of the memory location providing the multi-bit error, and thus distinguish between an intermittent error and a persistent error. Persistent errors are determined to exist when a MBE error exists during an initial reading of data from a memory location, and a MBE error exists as a result of one or more retries of the read operations at the same memory location where the MBE error existed during the initial reading of the data.

In various embodiments, the solutions provided by the various embodiments augment other conventional techniques, such as error correction codes, to allow a retry protocol and recovery mechanism. In addition, conventional correction codes cannot disambiguate intermittent soft errors, such as those induced by electrical noise, from a persistent error, such as struck-at memory fault. The memory retry mechanism and retry operations are used to differentiate intermittent soft errors that may be caused by factors external from multi-bit soft errors in the data stored in a given memory location of a memory device. The retry mechanisms and retry operations provide a fault tolerant mechanism for avoiding errors that would otherwise cause an application failure. Furthermore, unlike approaches such as chip-kill and DRAM sparing, the embodiments employing the retry mechanisms and retry operations described herein require no additional memory storage overhead, other than the error correction code, and so are less expensive, both with respect to cost of the device and with respect to the required allocation of memory within the device.

FIG. 1 illustrates a functional block diagram of a system 100, including a processor 110, an interface 120, and memory device 130. In various embodiments, processor 110 is coupled to interface 120 through connection 104. In various embodiments, interface 120 is coupled to memory device 130 through connection 106. Connection 104 and connection 106 are not limited to any particular type of connection, and can include any type of connection or types of connections used to allow the coupling of processor 110, interface 120, and memory device 130. Connection 104 and connection 106 may include physical conductors, wireless connections, or both physical conductors and wireless connections.

In various embodiments, one or more of processor 110, interface 120, and memory device 130 are included on a circuit board 102. Circuit board 102 can include a port 101 for coupling through connection 103 to the devices on circuit board 102, to one or more external devices (not shown in FIG. 1). Connection 103 is not limited to any particular type of connection, and can include physical conductors, wireless connections, or both physical conductors and wireless connections.

Processor 110 is not limited to any particular type of processor. In various embodiments, processor 110 is not a single processor. In various embodiments, processor 110 includes any number of processors operating in a multi-processor system. In various embodiments, processor 110 includes cache memory 112. In various embodiments, each of the multi-processors included in processor 110 include a cache memory 112. In various embodiments, each of a plurality of multi-processors included in processor 110 access cache memory 112, and include a separate cache memory associated with each separate processor.

In various embodiments, interface 120 includes one or more memory directory blocks 122A through 122P. In various embodiments, each memory directory block 122A through 122P includes a memory manager (MM). By way of illustration, memory directory block 122A includes memory manager 124A, and memory directory block 122P includes memory manager 124P. In various embodiments, each memory directory block included in interface 120 would include a separate memory manager, as represented by dotted line 122B. In various embodiments, each memory manager serves and is associated with a designated portion of the memory included in memory device 130.

Memory managers 124A through 124P function as an interface between the memory directory blocks 122A through 122P containing the given memory manager and the memory designated as being backed by a node associated with the given memory directory block. For instance, memory directory block 122A includes memory manager 124A, wherein memory manager 124A functions as an interface between memory directory block 122A and a designated portion of memory device 130 supported by and associated with the memory directory block 122A. In another instance, memory directory block 122P includes memory manager 124P, wherein memory manager 124P functions as an interface between memory directory block 122P and a designated portion of memory device 130 that is supported by and associated with memory directory block 122P.

In various embroilments, one or more of the memory managers 124A through 124P provide one or more of the following:

arbitration and scheduling of the memory devices, including memory devices according to bank, row, and column dimensions to maximize the effective pin bandwidth of the memory devices;

Fine-grained atomic memory operations (AMOs);

Memory refresh and necessary housekeeping functionality to maintain the memory cells used to store data within the memory device;

Automatic scrubbing of memory to repair single-bit upsets (single bit errors);

Data poisoning and deferred error handling; and

Detection and correction of single bits error, counting and providing histogramming of the detected single bit errors.

Spare-bit insertion based on the histogramming of the detected single bit errors.

Spare-bit insertion to repair persistent memory errors.

In various embodiments, a given memory manager includes any combination of the following: memory sequencer 142, a plurality of subbanks 144, cache 146, configuration table 148, multiple bit error (MBE) error table 150, single bit error (SBE) error counter 152, atomic memory operation (AMO) unit 154, and scrub engine 156. In various embodiments, memory sequencer 142 uses subbanks 144 to store received requests to read data from the memory device associated with the memory manager 124A. In various embodiments, read data is stored in cache 146. In various embodiments, memory sequencer 142 initiates a retry operation in instances where read data is determined to have a MBE error.

In various embodiments, configuration table 148 is used to store configuration information used by the memory manager 124A, including in some embodiments storing a value for N representing a maximum number of retry operations the memory sequencer 142 is to perform during a given retry operation. In various embodiments, MBE error table 150 is used to log the detection of MBE errors in read data, including intermediate errors and persistent errors. In various embodiments, SBE error counter 152 is used to log the number of occurrences including single bit errors occurring on a particular column of data for one or more portions of the memory device 130 associated with the memory manager 124A. In various embodiments, AMO unit 154 is used to perform atomic memory operations on one or more memory locations in the portion of memory device 130 associated with memory manager 124A. In various embodiments, AMO unit 154 performs a read-modify-write operation on one or more memory locations in the portion of memory device 130 associated with memory manager 124A.

In various embodiments, scrub engine 156 is used to perform a memory scrubbing operation on some portion of memory device 130 associated with the corresponding memory manager 124A. In various embodiments, scrub engine 156 scrubs a portion of the memory device 130 in order to detect and correct single bit errors in the scrubbed portion of the memory device 130. In various embodiments, scrub engine 156 performs a spare-bit insertion scrubbing operation, including performing a read-modify-write sequence to insert a new spare-bit into data stored in all, or in some embodiments, some portion of, the memory locations included in a the memory device 130 and associated with the memory manager 124A.

Figure 2A:
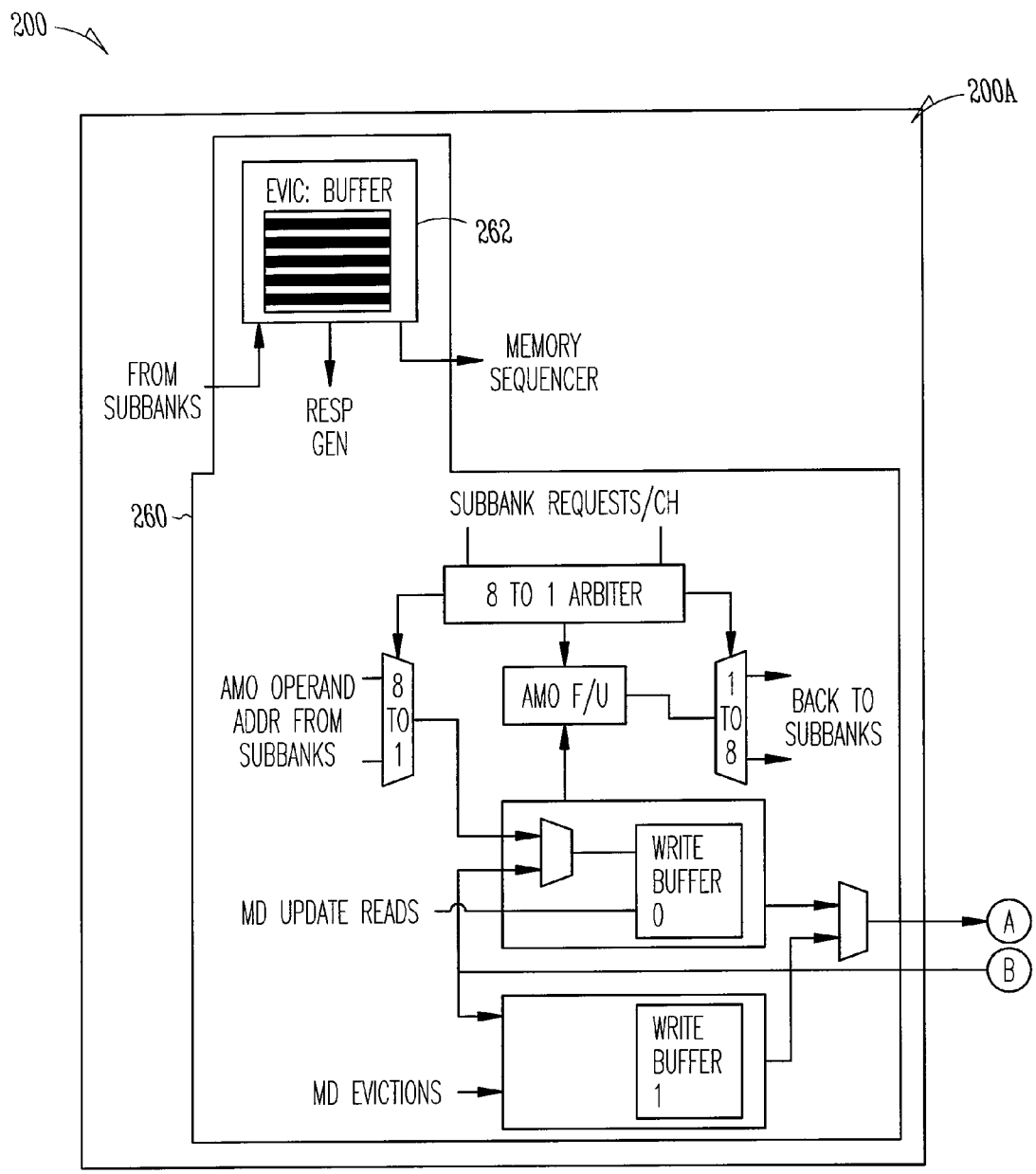
FIGS. 2A and 2B show a functional block diagram of an illustrative memory manager.
Figure 2B:
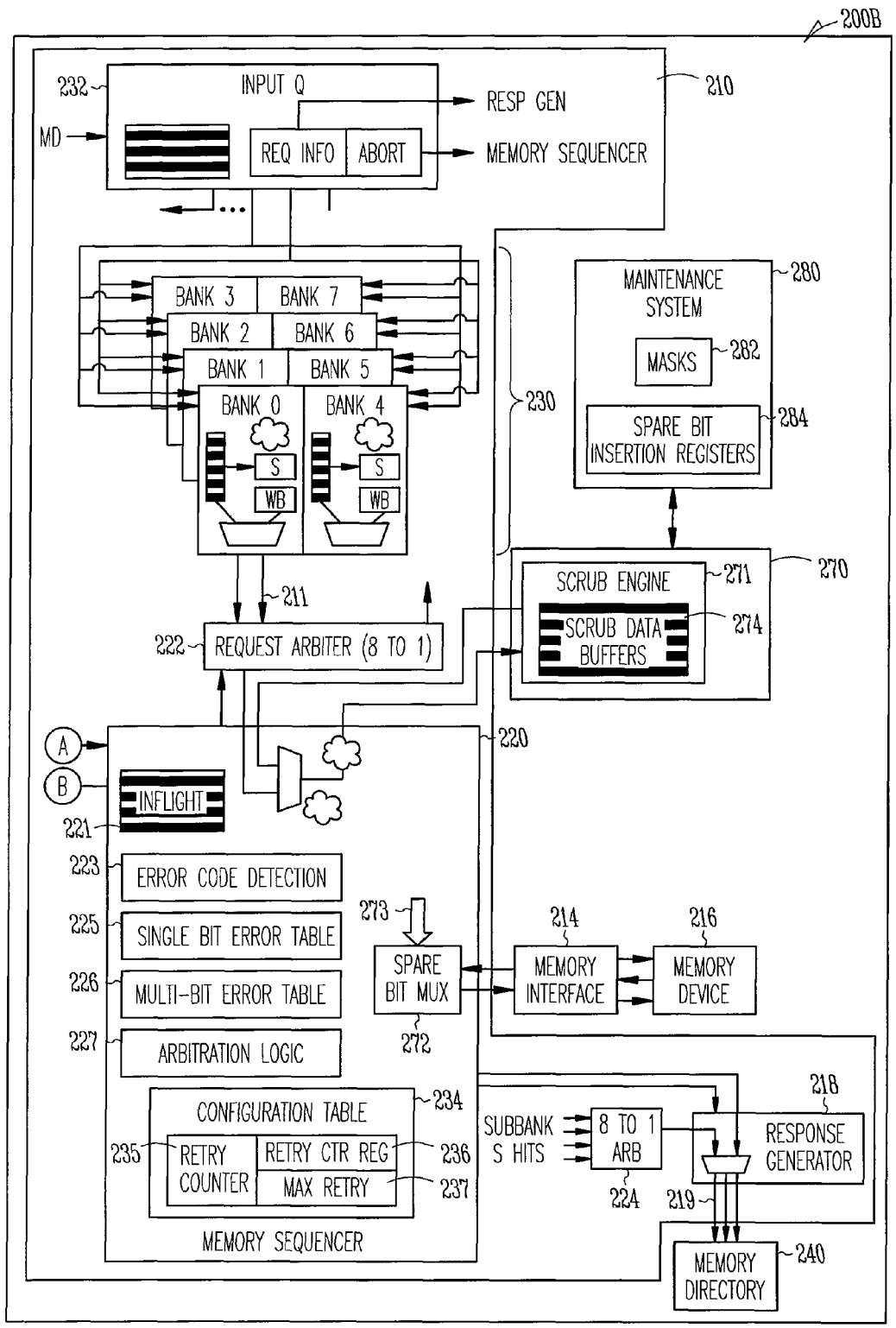

A more detailed description of memory managers and the functions provided by the memory managers, for example but not limited to memory managers 124A through 124P, is provided in conjunction with FIGS. 2A and 2B, and the written description included herein.

Returning to FIG. 1, memory device 130 is not limited to any particular type of memory device. In various embodiments, memory device 130 includes a plurality of memory chips 132 represented by memory chips 132A-M. In various embodiments, memory device 130 include DRAM memory. In various embodiments, memory chips 132A-M include DRAM memory. In various embodiments, one or more of memory chips 132A-M are double-data-rate two synchronous dynamic random access (DDR2 SDRAM) memory devices. Memory device 130 is not limited to any particular configuration. In various embodiments, memory chips 132A-M are organized as five 8-bit devices, for a total of 40 bits. In some embodiments, only 39 of the 40 bits are used, where 32 bits are used for data and 7 bits are used to store an error correction code associated with the data bits. In various embodiments, the remaining bit is used to dynamically map out bad bits within the device, including using a spare bit in spare-bit insertion operations to repair persistent single bit memory errors within the memory location or locations providing the spare bit and having a persistent single bit error.

In various embodiments, a memory device, such as memory device 130, provides a given number of bits in any given memory location, wherein not all of the bits in the memory location are used for data and the associated error correction code. In various embodiments, and extra or "spare bit" that exists in each memory location is not initially required in order to store data and the associated error correction code at the memory location. By way of illustration, a memory location includes 40 bits, wherein only 39 bits are needed to store the data allocated for a memory location. In various embodiments, the data includes, by way of illustration, 32 bits allocated for data, and an additional 7 bits allocated for an error correction code associated with the data stored in the 32 bits, all for a total of 39 bits. The 40th bit is considered the spare bit.

When a spare-bit insertion operation has been activated for a given memory location, a given one of the bit positions for the memory location, which can be any one of bits 1-39, is designated as the "bad" bit. A "bad" bit designates a bit position within a memory location that will not be used to store a bit, and the spare bit position will be used to maintain a 39 bit storage capacity within the memory location. In various embodiments, any data bit in data designated to be stored in the memory location and located at a bit position within the data corresponding to the designated "bad" bit is moved for storage purposes to some other bit position in the memory location. The designated "bad" bit position is ignored, and the spare bit is used to maintain the 39 bit storage capability of the memory location.

In operation, interface 120 in system 100 can receive a request to read data from one or more memory locations in memory device 130. The request to read data can come from processor 110. In various embodiments, multiple requests to read data are being handled at interface 120 at any given time. In various embodiments, requests from both processor 110 and scrub engine 140 are capable of being or are being processed at interface 120 at any given time. The term "requester" is used throughout the specification to refer to any application or device that requests data to be read from one or more memory locations in a memory device capable of storing data.

For a given request to read data from a particular memory location, the memory location including data and the associated error code is read from the memory device 130 and provided to the particular memory manager 124A-124P managing the request. In various embodiments, if a spare-bit insertion operation has been completed for the particular memory location, a spare-bit removal operation will be performed on the data as accessed from the particular memory location before further processing of the accessed data is performed. The spare-bit removal operation is described in further detail herein at various portions of the specification.

After reading the data, and after performing a spare-bit removal operation if this operation is activated for the memory location from with the data has been read, the particular memory manager 124A-124P managing the request will use the error correction code included in the read data. This includes determining if the read data has a bit error, including whether the data includes a single bit error or a multi-bit error. In various embodiments, each memory manager includes a set of counters, for example SBE error counter 152, operable to count the number of occurrences of a single bit error for a given bit position in the data.

In various embodiments, when a single bit error is detected, a given counter corresponding to the bit position where the single bit error occurred is incremented. A set of these counters, each having a value for the number of occurrences of single bit errors for the data, represent a histogram of the single bit errors occurring on a bit-by-bit basis for the data read from the memory associated with the set of counters. In various embodiments, the histogram of the single bit errors is used to determine both when, and for which bit, a spare-bit insertion operation is to be activated and performed on the memory locations, as further described herein.

In various embodiments, if a single bit error is detected, the single bit error is corrected, and the corrected data is forwarded to the processor in instances where the processor 110 requested the data. In various embodiments, the corrected data is forwarded to the requester having made the request for the read data. In various embodiments including scrub engine 156, where the scrub engine requests the data from memory device 130 and a single bit error is detected, the scrub engine 156 is operable to correct the data using the error correction code associated with the data, and to write the corrected data and the error code back to memory device 130. In various embodiments, any single bit errors detected as part of a scrub engine operation are also added to a count value in the counters associated with the histogram, by incrementing the counter associated with the particular bit where the single bit error occurred.

In various embodiments, when interface 120 receives a request to provide data from memory device 130, and the read data from a particular memory location is determined to have a multi-bit error, a retry operation is initiated. In various embodiments, the retry operation is only initiated when the read data having the multi-bit error is indicated as being non-poisoned data. Poisoning of data in a memory location can be used as an indication that a particular memory location in a memory device includes a persistent multi-bit error. Poisoning may be indicated by a particular value or a particular bit pattern associated with poisoning within a particular memory location where the memory location has been determined to be associated with a persistent multi-bit error.

For the memory locations within a memory device, or in some embodiments where only some particular portions or sections of the memory locations within a memory device are affected, when a spare-bit insertion operation has not been activated for the memory location, data is read from and data is written to the memory location without using a spare-bit insertion operations as part of either the reading or the writing of the data. As part of the reading process, the read data is checked for single bit errors on a bit-by-bit positional basis, and the number of occurrences of the single bit errors for each bit position is tracked using an individual counter for each bit position. The values in these counter can be used to construct a histogram representative of the distribution of the single bit errors that have occurred within the memory locations. Based on this histogram, a determination can be made to activate a single-bit insertion operation for all of the memory location, or in some embodiments, for one or more designated portions of the memory locations within the memory device. Making this determination includes determining that a particular bit position within the data being stored in the memory location of the memory device is faulty, and is designated as the "bad" bit related to a bit position within the data and within the memory locations, all with respect to spare-bit insertion operations. The designated "bad" bit can be a bit position associated with data bits, or a bit position used to store bits including the error correction code associated with the data bits.

As part of activating the spare-bit insertion operation, a spare-bit insertion scrubbing operation is performed. The spare-bit insertion scrubbing operation basically scrubs through the memory locations for which spare-bit insertion operations are to be applied, and performs a read-modify-write operation on the data at each of these memory locations. In various embodiments, all of the memory locations associated with a memory device are scrubbed. For each of the affected memory locations, the read-modify-write operation includes reading the data from the memory location, and writing the data back to the same memory location after applying a spare-bit insertion operation on the data. The spare-bit insertion operation involves re-arranging the bits in the data so that the bit position in the data designated as a "bad" bit position is not used in the memory location to store a data bit, and the spare-bit position in the memory location will be used to store a data bit from the re-arranged data following the spare-bit insertion operation. In various embodiments, the modify portion of the spare-bit insertion scrubbing operations includes checking the read data for single bit errors, and correcting the single bit errors using the error correction code associated with the read data.

Because the spare-bit insertion scrubbing operation takes some time to complete for all the affected memory locations, and because memory accesses to the memory device are not necessarily suspended during the spare-bit insertion scrubbing operation, tracking of the memory addresses within the memory device that have and have not been scrubbed are maintained until all the spare-bit insertion scrubbing operations has been completed on all the affected memory locations. In various embodiments, tracking includes tracking of a linear address to determine if the spare-bit insertion scrubbing operation has or has not been performed on given memory location.

Once all of the memory locations that are included in the spare-bit insertion scrubbing operation have been scrubbed using the read-modify-write operation, a register value is set that indicates the fact that that the spare-bit insertion scrubbing operation for the affected memory locations has been completed. In various embodiments, the affected memory locations can include all memory locations in a given memory device. Once completed, the tracking of the memory locations relative to the spare-bit insertion scrubbing operation is no longer necessary, and is terminated.

Once the spare-bit insertion scrubbing operation has been completed, all of the affected memory locations have the spare bit inserted. Any write operations directed to store data in any of the affected memory locations will use the spare bit position in the memory location where the data is to be stored, so as to not use the bit position in the memory location designated as the "bad" bit to store a data bit. Further, once the spare-bit insertion scrubbing operation has been completed, any read operations performed on the affected memory locations will have a spare-bit removal operation performed on the read data in order to restore the data to the data's original bit order and bit arrangement as was present in the data before the spare-bit insertion operation was performed on the data.

During the spare-bit insertion scrubbing operation, read and write operation to the memory device will be performed using the appropriate spare-bit insertion and spare-bit removal operations only if the read-modify-write scrubbing operation has been performed on the particular memory location being accessed. No spare-bit operations will be performed on any of the particular memory location being accessed in a read or write operation if the read-modify-write scrubbing has not yet been completed on the particular memory location being accessed by the read or write operation. During the spare-bit insertion scrubbing operation, the tracking used to determine which memory locations have and have not been scrubbed is also used during any of the read or write operations to determine whether or not the spare-bit insertion operation is to be included as part of the read or write operation.

FIGS. 2A and 2B illustrate a functional block diagram of an illustrative memory manager 200, including portions 200A and 200B. Memory manager 200 is not limited to any particular type of memory manager. In various embodiments, memory manager 200 is any one of the memory managers 124A-124P as shown in FIG. 1. In various embodiments, memory manager 200 is coupled to memory directory 240, as shown in FIG. 2B.

In various embodiments, memory manager 200 includes any combination of the following: AMO unit 260, scheduling unit 210, and scrub unit 270. In various embodiments, AMO unit 260 is coupled to scheduling unit 210 and memory directory 240. In various embodiments, scrub unit 270 is coupled to scheduling unit 210.

In various embodiments, scheduling unit 210 is coupled to and associated with a portion of memory device 216, wherein other memory managers (not shown in FIGS. 2A and 2B) are associated with various different portions of memory device 216. Memory device 216 is not limited to any particular type of memory device, and in some embodiments is memory device 130 as described in conjunction with FIG. 1.

Again referring to FIGS. 2A and 2B, in various embodiments, scheduling unit 210 includes memory sequencer 220 coupled to subbanks 230 through request arbitrator 222. In various embodiments, memory sequencer 220 is coupled to memory directory 240 through response generator 218. In various embodiments, memory sequencer 220 is coupled to memory device 216 through interface 214. In various embodiments, subbanks 230 are coupled to response generator 218 through arbitrator 224.

In various embodiments, memory sequencer 220 includes any combination of the following: error code detection block 223, single bit error (SBE) table 225, multi-bit error (MBE) table 226, arbitration logic 227, and a configuration table 234. In various embodiments, error code detection block 223 is operable to determine if an error exists in read data, both single bit errors and multi-bit errors, based on the error correction code associated with the read data. In various embodiments, SBE table 225 includes a plurality of counter registers operable to store a count value for the number of detected single bit errors associated with a particular column of read data on a bit-by-bit basis. In various embodiments, MBE table 226 is operable to store addresses associated with memory locations that provided multi-bit errors, both intermediate errors and persistent errors, when data was read for the memory locations.

In various embodiments, configuration table 234 is operable to store configuration settings associated with memory manager 200. In various embodiments, configuration table 234 includes a retry counter 235 including a retry counter register 236 and a maximum retry register 237. In various embodiments, retry counter register 236 is operable to store a value for the number of retry read operations that have been performed during a given retry operation associated with a given memory location. In various embodiments, maximum retry register 237 includes a value for a maximum number of retry read operations that are to be performed during a given retry operation associated with a given read request.

In various embodiments, memory subbanks 230 may include a plurality of memory banks 0-7, and an input queue 232. In various embodiments, input queue 232 is coupled to memory directory 240, to response generator 218, and to memory sequencer 220. In various embodiments, input queue 232 is operable to receive from memory directory 240 requests for data to be read from one or more memory location in memory device 216. In various embodiments, subbanks 230 are operable to store these requests, along with a memory manager transaction identifier (MMTID) provided by memory sequencer 220 that uniquely identifies the stored request.

In various embodiments, scrub unit 270 includes scrub engine 271 coupled to memory sequencer 220 and coupled to spare bit mux 272. In various embodiments, scrub engine 271 is operable to provide memory scrubbing operations to any portions of memory device 216 that are associated with memory manager 200. In various embodiments, a scrub data buffer 274 included in scrub engine 271 is operable to store and provide information regarding scrub operation related to memory device 216. In various embodiments, spare bit mux 272 includes a series of 2-to-1 multiplexers, each of the multiplexers are individually controlled through control lines 273 coupled to the spare bit mux 272. Each of the individually controlled multiplexers control a data path for a single bit position within the data being transferred in either direction between the memory sequencer 220 and the memory device 216. In various embodiments, the status of the control lines 273, and thus the control of the individual data paths for each bits in the data being transferred, is controlled by outputs provided by the scrub engine 271 that are coupled to the control lines 273.

In various embodiments, the scrub engine controls the status of the control lines 273 during scrubbing operations, including spare-bit insertion scrubbing operations, and including any routine scrubbing operation, in order to control the data paths of the individual bits within the data being transferred between the memory sequencer 220 and the memory device 216. In various embodiments, control lines 273 are controlled by memory sequencer 220 in order to control the data paths of the individual bits in the data being transferred between the memory sequencer 220 and the memory device 216 during read and write operations involving memory device 216. During these read and write operations, the status of control lines 273 is determined based on whether or not a spare-bit insertion operation has been activated and has been completed for the particular memory locations within memory device 216 that are involved in the particular read or the write operation being performed.

In various embodiments, memory manager 200 includes a maintenance system 280. Maintenance system 280 is not limited to any particular type of maintenance system, and can include any software, hardware, firmware, or any combination of software, hardware, or firmware operable to carry out the functions provided by maintenance system 280. In various embodiments, maintenance system 280 performs polling, histogramming, making determinations, tracking, and storing data related to the spare-bit insertion operation related to memory device 216. In various embodiments, maintenance system 280 is coupled to scrub unit 270, and thus is coupled to memory sequencer 220.

In various embodiments, the memory manager updates histograms within the memory mapped registers (MMRs). The maintenance software included in the maintenance system 280 monitors the histograms, and makes determinations regarding spare-bit insertions based on the status of the monitored histograms. Masks, as further described below, are generated by the hardware based on the spare-bit selection MMRs. In various embodiments, the masks are used to control the spare bit mux 272, as further descried herein.

Figure 8:
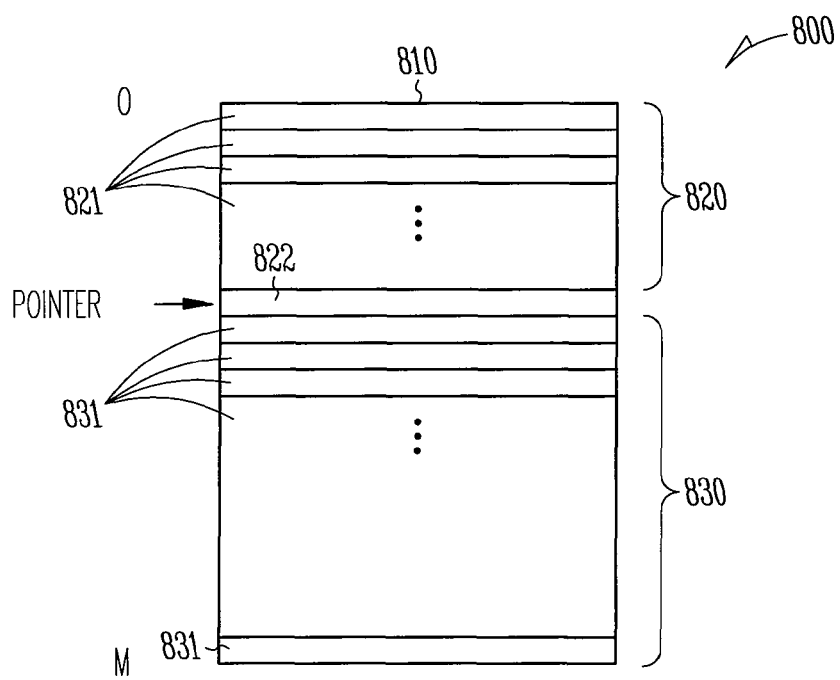
FIG. 8 shows an illustrative memory management register including memory address locations and spare-bit insertion mappings.

In various embodiments, a software component of the maintenance system 280 includes one or more masks 282. Masks 282 are not limited to any particular types of masks, and in various embodiments are one or more registers designated to store data related to masks used in spare-bit insertion operations. In various embodiments, masks are used to store a value indicating which of the bit positions within data has been as the "bad" bit position relative to a set of memory locations in the memory device. In various embodiments, maintenance system 280 includes one or more spare-bit insertion registers 284. Spare-bit insertion registers includes one or more registers for storing data related to memory locations addresses that have and have not had a spare-bit insertion operation performed on them during a spare-bit insertion scrubbing operation. In various embodiments, one possible configuration of the spare-bit insertion registers is illustrated in FIG. 8, which illustrates a memory management register including memory address locations and a pointer.

Referring again to FIG. 2A, in operation, maintenance software within the maintenance system 280 is operable poll one or more of the registers in the memory sequencer 220, including but not limited to the single bit error table 225. Polling the single bit error table 225 includes retrieving the values stored in the counters included in single bit error table 225. After polling these values, maintenance system 280 is operate to use the polled values to construct a histograms that track the location of a plurality, or in some instances, all of the single bit errors in a memory device. In various embodiments, maintenance system 280 is operable to analyze the histogram and to determine, based on one or more decision criteria, whether to activate a spare-bit insertion operation. The decision criteria is not limited to any particular decision criteria, and can be any decision criteria used as a basis to determine that a spare-bit insertion operation is to be activated. Various decision criteria are discussed with respect to FIG. 6. However, the decision criteria used by the maintenance system 280 to determine if spare-bit insertion operation is to be activated are not limited to those shown by FIG. 6.

In various embodiments, the spare-bit insertion operation is performed by a spare-bit hardware engine, which in various embodiments is included in the scrub engine. In various embodiments, determining of the spare-bit insertion process is to be initiated includes reading a MMR to make sure the spare-bit hardware engine is quiet, that is, not already activated. In addition to determining if a spare-bit insertion operation is to be activated, maintenance system 280 is operable to determine which of the bit positions in the data and the memory locations is to be designated as the "bad" bit position. In various embodiments, this designation is determined using data provided by the constructed histogram.

In various embodiments, once a determination is made to activate spare-bit insertion operation, and the designation as to which bit position is the "bad" bit position has been made, hardware, in some embodiments, a hardware portion of the maintenance system, is operable to generate a mask to indicate which bit position is the "bad" bit position. In various embodiments, the mask is stored in masks 282. In addition, masks 282 can include a mask that represents a value for the arrangement and ordering of the bits before spare-bit insertion operations are implemented, which can be referred to as an old mask. In various embodiments, initiation a spare-bit insertion operation includes setting a status including a "go" indication in one of the MMRs indicating that the spare-bit insertion engine should initiate the spare-bit insertion operation. In various embodiments, once initiated, a spare-bit completion MMR is monitored, and if set, indicates that the spare-bit insertion operation has been completed.

In various embodiments, spare-bit insertion registers 284 are prepared for a spare-bit insertion scrubbing operation by resetting a pointer to the starting address of the memory locations to which the spare-bit insertion operation is going to be applied. In various embodiments, this includes all of the memory locations included in a memory device 216, and so the pointer is set to the first or lowest memory location address in memory device 216. In various embodiments, a register in the spare-bit insertion registers 284 is set to indicate that the spare-bit insertion operation is activated. The maintenance system provides the spare-bit insertion mask to the scrub engine 271, and indicates to the scrub engine 271 that the scrub engine 271 is to start the spare-bit scrubbing operation. Scrub engine 271 manipulates control lines 273 in order to perform a read operation at the starting memory location indicated by the pointer, performs the modify operation, and the uses the spare-bit insertion mask provided by the maintenance system 280 to manipulate control lines 273 in order to write the data back to the memory location using a spare-bit insertion operation based on the spare-bit insertion mask.

For each memory location, as the read-modify-write scrubber operation is completed, the scrub engine notifies the maintenance system 280 of the completion, so that the maintenance system 280 track the process of the spare-bit insertion scrubbing operation by modify the pointer in the spare-bit insertion register. When al of the spare-bit insertion scrubbing operation have been completed for all the memory locations to which the spare-bit insertion operation are to be applied, the maintenance system sets a value in one of the spare-bit insertion registers 284 to indicate that the spare-bit insertion scrubbing operation has been completed. Once this is completed, further read and write operations involve the memory location to which the spare-bit insertion operations have been applied are performed using the spare-bit insertion mask to properly perform the spare-bit insertion and spare-bit removal operations appropriate for the write and read operations that involve the affected memory locations.

In operation, requests to read data are provided by memory directory 240 to scheduling unit 210. In various embodiments, the requests to read data are provide by the memory directory 240 through input queue 232, and are stored in one of the subbanks 230.

In various embodiments, memory sequencer 220 keeps track of each request individually. In various embodiments, memory sequencer 220 is operable to assign a memory manager transaction identifier (MMTID) to a request, the MMTID to uniquely identify the request from any other requests being processed by memory sequencer 220. In various embodiments, the MMTID for each request are stored in inflight table 221. Memory sequencer 220 organizes and controls the order of the requests to read data from a portion of memory device 216, including the actual receiving of the requested data between the memory sequencer 220 and the memory device 216, using arbitration logic 227. When a particular request is being operated on, a request for the data associated with the particular request is made through request interface 214, and the associated data is read from the memory location within memory device 216. In various embodiments, if a spare-bit insertion operation has been activated and has been performed on the memory location from which the data is being read, spare bit mux 272 is actuated in a manner that causes a spare-bit insertion operation to be performed on the read data as the read data is received from memory interface 214.

With respect to read data, the spare-bit insertion operation is a spare-bit removal operation, wherein the read data from the memory device includes a valid bit stored in a spare bit location in the memory location from which the data was read, and the spare-bit removal operation removes the bit from the spare-bit position and restores the read data to an bit order and a bit arrangement that no longer includes the spare bit position, and no longer excludes a bit position in the data that was deterred to be a "bad" bit position and thus is not used to store valid data in the memory location from which the data was read. The read data, after having been restored using the spare-bit removal operation, is returned to memory sequencer 220. In various embodiments, the returned data includes data bits and an error correction code associated with the data bits.

In various embodiments, memory sequencer 220 includes an error code detection block 223 operable to extract the data bits and the error correction code associated with the data bits as received in the read data, and to determine if an error exists in the data bits based on the error correction code. In instances where no errors are detected, memory sequencer 220 passes the data to response generator 218, which further passes the data to memory directory 240. In instances where an error is detected, the error code detection block 223 is operable to determine if the error is a single bit error or a multi-bit error. If the error is a single bit error, the error correction code can be used to fix the single bit error, and to output the corrected data to the requester. In various embodiments, the single bit error is logged in a SBE table 225. In various embodiments, logging a single bit error includes storing in the single bit error table 225 an indication as to the bit position within the data bits where the single bit error occurred. In various embodiments, the bit position is associated with a particular column line used in reading the bits included in a plurality of memory locations and associated with a same particular bit position within each of the plurality of memory locations.

In instances where memory sequencer 220 determines that a multi-bit error has occurred in the read data, memory sequencer 220 can initiate a retry operation. In various embodiments, initiation of a retry operation includes marking the request with a squash bit to indicate that the request will be retried. In various embodiments, a squash bit includes changing the status of one or more bits included in the MMTID associated with the request for which the retry operation is being performed. The marking of a request with a squash bit prevents the memory directory 240 from getting multiple read replies from a single request that is being retried due to a multiple-bit error.

In various embodiments, memory sequencer 220 can arbitrate the requests going to the memory device 216 using arbitration logic 227 so that the requests associated with the retry operation take precedence over any other requests for data directed to the memory device 216. In various embodiments, upon initiation of a retry operation, memory sequencer 220 will immediately (subject to the bank cycle time of the device) schedule the retry operation. Arbitration logic 227 within memory sequencer 220 gives the retry request priority so that no other requests are allowed to be reordered in front of the retry operation. In other words, the next reference to the memory device 216 where the multi-bit error occurred is guaranteed to the retry request.

In various embodiments, memory sequencer 220 includes a retry counter 235. Retry counter 235 is operable to count the number of retry operations performed for any given retry operation. In various embodiments, retry counter 235 includes a retry counter register operable to store a value indicating the number of retry operations that have been performed during a given retry operation and for a given request. In various embodiments, retry counter 235 includes a maximum retry register 237. Maximum retry register 237 is operable to store a value indicating the maximum number of times a retry operation is to be performed for any given request. In various embodiments, a re-reading of the data from a memory location having a multi-bit error results in the value for the retry counter register 236 being incremented by one. Before any additional re-reading operation for a given request and associated with the retry operations are performed, the value stored in the retry counter register 236 is compared to the value stored in the maximum retry register 237. If the value in the retry counter register 236 is equal to (or for some reason greater than) the value stored in the maximum retry register 237, no additional re-tries to re-read the data in the given memory location will be performed during the given retry operation associated with the given request. If all the readings for the data from the given memory location that are allowed based on the allowable number of re-tries each result in a multi-bit error being detected, the given memory location will be deemed to have a persistent error.

In various embodiments, if a persistent error is detected, the persistent error is logged in MBE table 226. In various embodiments, logging a persistent error includes storing an address associated with the memory location or memory locations in memory device 216 that generated the persistent error. In various embodiments, if a spare-bit insertion operation has been activated for the memory location being re-read as part of a retry operation, the spare-bit insertion operation will be performed on the re-read data on each re-reading before the error code detection operations are performed on the re-read data.

In various embodiments, scrub engine 271 as included in scrub unit 270 performs a memory scrubbing operation, including the scrubbing of memory locations included in memory device 216, to detect and correct bit errors. Assuming that soft errors follow a uniform distribution in a memory device, the longer a word of used data lives in the memory device 216, the more likely it will be to suffer the effects of any number of soft errors. In the worst case, a sufficient number of bits will be upset to result in silent data corruption. In an effort to prevent independent single-bit errors from compounding to form multi-bit errors and thus result in an application error, the memory manager 200 implements a hardware-based memory scrub engine 271. The scrub engine 271 is capable of cycling through one or more portions of memory device 216, and reading and correcting any encountered single-bit errors by writing back corrected data. In various embodiments, if a spare-bit insertion operation has been activated for the memory location from which the data is being read as part of a scrubbing operation, spare bit mux 272 is actuated in a manner that causes a spare-bit insertion operation to be performed on the read data as the read data is received from memory interface 214 and before the read data is passed to the scrub engine for further processing. The scrub engine 271 could have been implemented to write back non-poisoned double-bit errors as poisoned errors. However, this would result in a loss of the capability of detecting faulty stuck-at memory bits that can be found when a particular word consistently suffers from single-bit errors even after being scrubbed repeatedly.

In order to make the scrub engine 271 as non-intrusive as possible, it is desirable to perform scrub reads when the connection between the one or more portions of memory device 216 is otherwise idle. At the same time, certain quality of service (QoS) guarantees must be made, ensuring that the entire memory device 216 is scrubbed with a specified refresh frequency. To satisfy these requirements, scrub engine 271 uses a scheme in which a memory device scrub cycle is broken up into fixed periods, each of which will include a single scrub read request. In addition, each scrub period is divided into two distinct time regions, the first of which will perform an early scrub read if no other traffic is present at the eight-to-one request arbiter. However, at some point the scrub request must be considered a priority, and in the second phase of each period, user requests will be blocked out allowing the memory device 216 to idle and make way for the pending scrub request.

As an alternative to the memory device auto-refresh capability, the scrub unit 270 may in some embodiments implement a distributed refresh algorithm that avoids the bank quiescence necessary with auto-refresh, and consumes less pin bandwidth than auto refresh. However, with higher-density parts (with more rows that need to be refreshed in a distributed manner) the benefit is more modest. Distributed refresh works by interleaving reads requests, whose purpose is to merely touch and refresh memory, into the normal request stream. When distributed refresh is enabled, scrubbing is piggy-backed on top of it, allowing all of the scrub reads to be performed at no cost. With memory scrubbing, the memory manager 200 is able to cope with uniformly distributed memory device soft errors without sacrificing memory bandwidth.

In various embodiments, when it is determined that a spare-bit insertion operation is to be activated, the entire memory associated with a particular memory manager, such as memory manager 200, will be processed using the spare-bit insertion scrubbing process, and thereafter will be operated on with regards to any read or write operations by using the spare-bit removal and insertion operation respectively. It would be understood that embodiments are not limited to having the entire memory designed for spare-bit insertion, and that some predetermined portion or portions of a memory device can be designated on an individual basis for spare-bit insertion scrubbing and for spare-bit insertion operations. In would be further understood that in embodiments wherein the entire memory is not designated for spare-bit insertion operations, individual tracking of the portions of the memory locations for which spare-bit insertion operations, and the state of these portions with respect to spare-bit insertion scrubbing would be individually maintained and tracked.

In various embodiments, the tracking of these spare-bit insertion operation and spare-bit scrubbing operations, wherein for the entire memory or for portions of a memory device, are tracked and maintained in spare bits insertion registers, such as spare-bit insertion registers 284 as shown in FIG. 2B. In various embodiments, one or more masks 282 are operable to store information related to which bits within a memory locations, or within a plurality of different memory locations, have been designated as the "bad" bit. In various embodiments, the masks 282 and the spare-bit insertion registers are included in a maintained system, such as maintenance system 280 as shown in FIG. 2B.

Figure 3A:
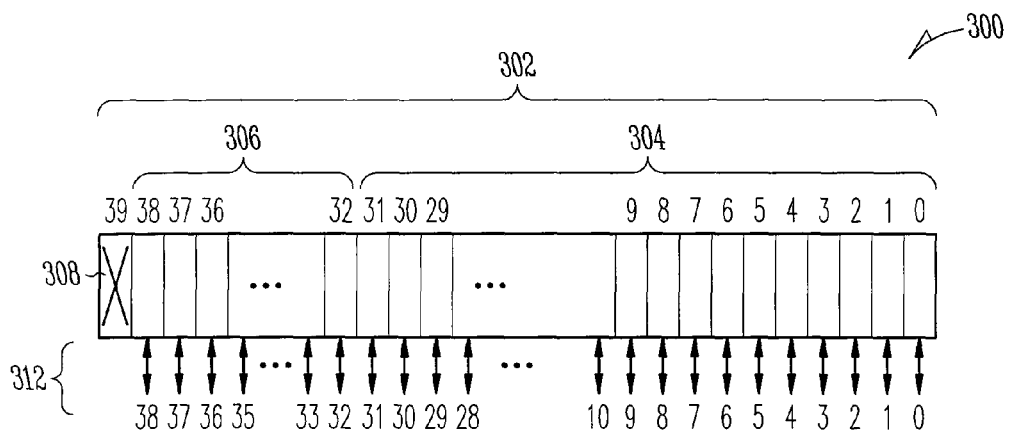
FIG. 3A shows an illustrative memory location for storing data.

FIG. 3A shows an illustrative memory location 300 for storing data. Memory location 300 may be any addressable memory location in a memory device, such as but not limited to memory device 130 as shown in FIG. 1, or memory device 216 in FIG. 2B. As shown in FIG. 3A, memory location 300 includes a plurality of bits 302. In various embodiments, the plurality of bits 302 includes a plurality of data bits 304. In various embodiments, the plurality of bits 302 includes a plurality of error correction code (ECC) bits 306. In various embodiments the plurality of bits 302 includes at least one spare bit 308. In various embodiments, ECC bits 306 are used to store an error correction code associated with the data stored in the plurality of data bits 304. The data stored as the ECC bits 306 are read in conjunction with the reading of the plurality of data bits 304 on read operations of memory location 300, and used to determine if a single bit error or if a multi-bit error has occurred in the read data. In addition, the data stored as ECC bits 306 can be used to determine if a soft error has occurred during the initial reading of data from memory location 300 by using the data stored as ECC bits 306 to determine if a single bit error or a multi-bit error exists in the data read from memory location 300 during one or more retry operations involving re-reading of the data from memory location 300.

In various embodiments, memory location 300 as illustrated in FIG. 3A represents data as stored in a memory location that has not been activated for a spare-bit insertion operation. As such, spare bit 308 is shown in FIG. 3A as storing an "X" meaning that this bit is designated as a "don't care" value, and that any data stored at spare bit 308 is not part of the data bits 304 or the error correction code bits 306 written to and read from this memory location. Since no spare-bit insertion has been activated for this memory location, the bits as written to and as read from this memory location correspond directly to the bit positions and the bit order in which the individual bits were provided in the original data that was provided to be stored in the memory location 300 of FIG. 3A, as indicated by arrows 312.

Figure 3B:
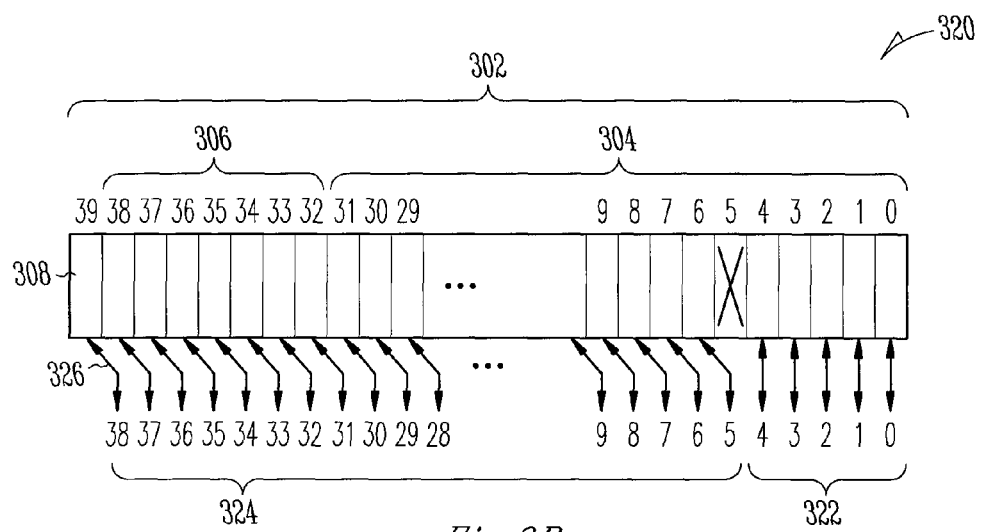
FIG. 3B shows an illustrative memory location for storing data.

FIG. 3B illustrates a memory location 320. Memory location 320 includes a plurality of bits 302, includes a plurality of data bits 304, labeled as bits 0 through bit 31, and a plurality of error correction code bits 306, labeled as bit 32 through bit 38. In addition, memory location 320 includes a spare bit 308 labeled as bit 39. In various embodiments, the spare bit 308 can be used as a data value in a spare-bit insertion associated with the data stored in memory location 300 and in place of one of the data bits 304. By way of illustration, bit 5 of the plurality of data bits 304 has been designated as a "bad" bit, as illustrated by the "X" shown in the bit 5 location. Since bit 5 is designated as a "bad" bit, no data is to be stored into or read out of bit 5 with respect to memory location 320. Instead, when data including 39 total bits of data is to be stored at memory location 320, the five least significant bit positions (bits 0-4) are stored in the corresponding bit positions within memory location 320, as represented by arrows 322. For the sixth least significant bit position (bit 5), representing the data bit that would normally be stored into bit position 5 of the memory location 320, the data is shifted to the next most significant bit, and is stored in bit position 6 of memory location 320.

Each of the corresponding bits 6-39 having bit positions in the data are also shifted up by one bit position, and are stored in the bit positions of memory location 320 having a bit designation one number higher than the bit position occupied by the data bit in the original data. This is represented by arrows 324. As a result, the most significant bit in the original data, which resides at bit position 38 in the original data, is stored into the spare-bit position 39 of memory location 320, as represented by arrow 326. As a result, the 39 bits in the original data are stored into memory location 320 without the use of the designated "bad" bit position at bit 5. When the data stored a memory location 320 is read, the process is reversed, and each of the data bits stored in bits positions 6-39 are shifted to again align with bit positions 5-38 respectively in the read data, as represented by arrows 324. The data bits stored in bit positions 0-4 are read directly into bit positions 0-4 in the read data, as represented by arrows 322. Thereafter, the read data from memory location 320, having been stored at memory location 320 having a designated bad bit position in bit 5, is read so as to have the same bit order and bit arrangement as was present in the original data, and without the need to use the designated "bad" bit position. The restoration of the read data is accomplished using the spare-bit removal process, for example but not limited to the spare-bit insertion operation performed using the spare-bit mux 272 of FIG. 2B.

Once the data has been read and restored using the spare-bit removal process, ordinary process of the read and restored data, including any processing including error code detection, can be performed in a same manner as would be performed on any data that had not had a spare-bit insertion operation performed on the data. By performing the spare-bit insertion operation as the last step in the data processing before the data is stored into a memory location, and by performing the spare-bit removal operation as the first step in the processing of data as soon as the data is read from the memory location, all the other processing of the data can be the same as with data that did not have these spare-bit insertion operation performed on the data. Thus, activating or not activating the spare-bit bit processing does not create a need to change any other processing of the data with respect to error code detection, or any other of data processing performed on data read from and stored to the memory locations of a memory device.

In various embodiments, where a persistent single bit error is determined to exist for a particular memory location, or for a particular group of memory locations, the memory location or the group of memory locations can use the at least one spare bit 308 as a replacement bit in the plurality of data bits 304 in order to provide a properly functioning data bit in place of the data bit determined as causing a persistent single bit error.

It would be understood that the use of the spare data bit could be expanded for any of the memory locations included in a memory device, and that memory location 320 is merely illustrate.

Figure 3C:
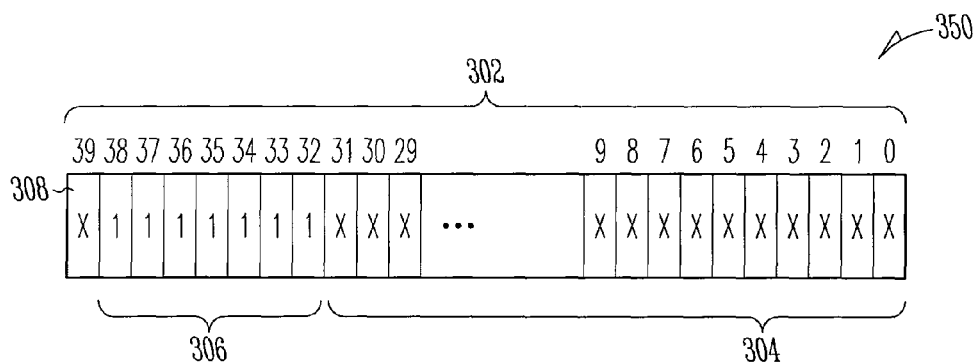
FIG. 3C shows an illustrative memory location for storing data.

FIG. 3C shows an illustrative memory location 350. In various embodiments, it is determined that a particular memory location, or group of memory location, are no longer usable even if a spare-bit insertion operation is available for the particular memory location or the group of memory locations. In various embodiments, a persistent multi-bit error is determined to exist for the particular memory location or locations. A single spare-bit insertion operation will not remedy this problem of a persistent multi-bit error associated with the memory locations. In such instances, a memory location, such as memory location 350, can be marked as "poisoned," which in various embodiments includes storing a particular value of data bits into the memory location to indicate that it is poisoned. Memory location 350 is shown in FIG. 3C as having a value of "1111111" stored in bits 32-38. In various embodiments, this value stored in the location for the ECC bits is an indication that the memory location 350 is poisoned, and therefore should not be used for storing data. Memory location 350 is not limited to any particular memory location, and is illustrative of any memory location that may be included in a memory device, such as but not limited to memory device 130 as shown in FIG. 1, or memory device 216 as shown in FIG. 2B. In various embodiments, memory location 350 is a memory location the same as illustrated by memory location 300 in FIG. 3A. In various embodiments, data bits 354 and spare bit 358 include an "X" wherein "X" is a "don't care" value for the value, if any, stored in spare bit 358. The data written to a memory location to indicate that the memory location is poisoned is not limited any particular data, and the data illustrated in FIG. 3C is merely illustrative.

Figure 4:
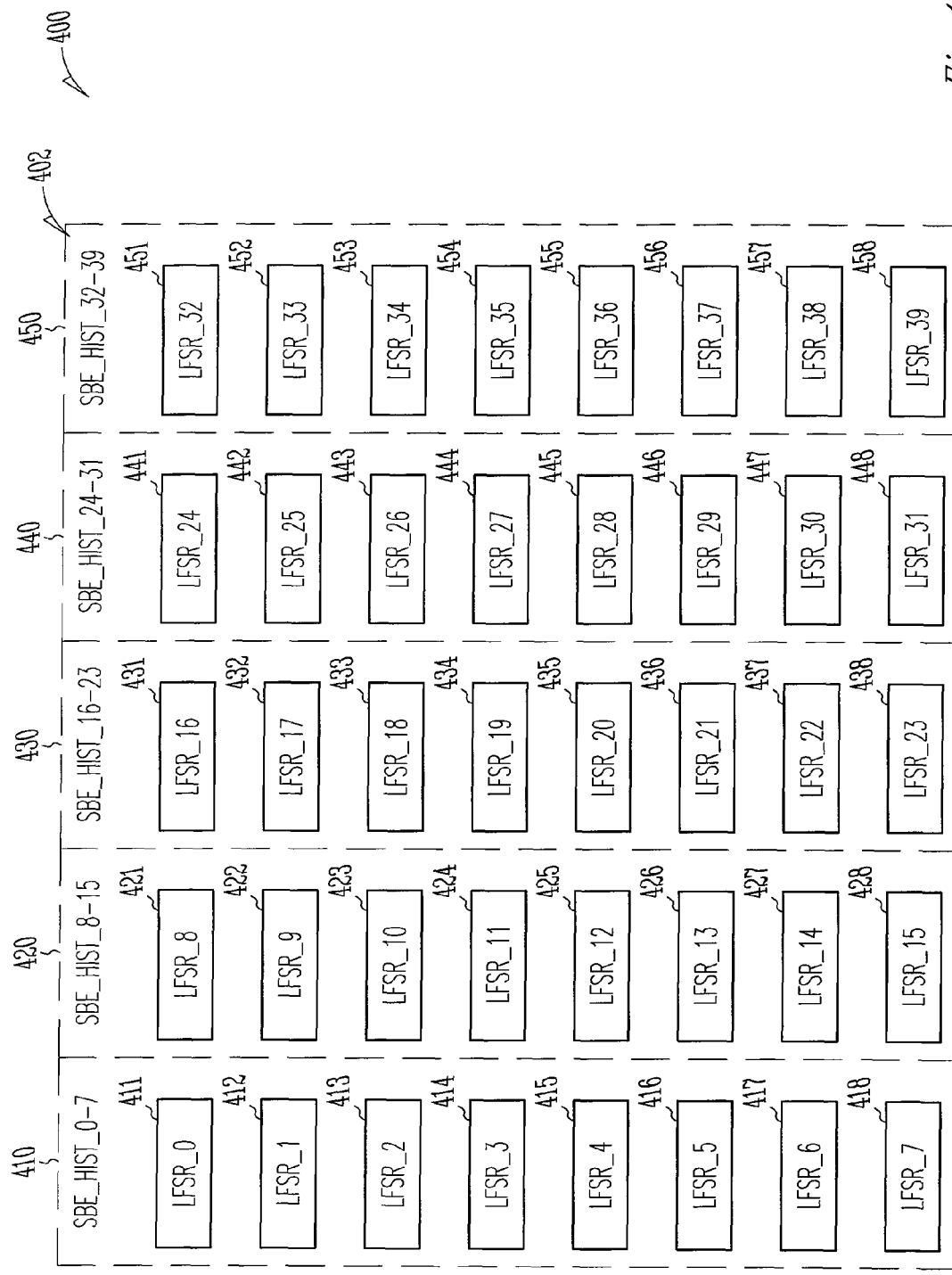
FIG. 4 shows an illustrative histogram data structure.

FIG. 4 shows an illustrative histogram data structure 400. In various embodiments, histogram data structure 400 includes a histogram 402 including a plurality of registers 410, 420, 430, 440, and 450. In various embodiments, each of registers 410, 420, 430, 440, and 450 include a plurality of linear feedback shift registers (LFSRs). As shown in FIG. 4, registers 410 include LFSR_0 through LFSR_7 as indicated by reference numbers 411 through 418 respectively, registers 420 include LFSR_8 through LFSR_15 as indicated by reference numbers 421 through 428 respectively, registers 430 include LFSR_16 through LFSR_23 as indicated by reference numbers 431 through 438 respectively, registers 440 include LFSR_24 through LFSR_31 as indicated by reference numbers 441 through 448 respectively, and registers 450 include LFSR_32 through LFSR_39, as indicated by reference numbers 451 through 458 respectively.

In various embodiments, LFSR_0 through LFSR_39 each represent an individual 8 bit histogram entry encoded in the linear feedback register and representing a count value for occurrences of a single-bit errors for a particular one of the data, and error correction, and spare bits associated with a memory location. However, it would be understood that a 39 bit (plus at least one spare bit) length for the data at a given memory location is illustrative, and embodiments are not limited to having a particular number of data bits associated with a given memory location. In various embodiments, histogram data structure 400 includes more or less LFSRs depending on the number of data bits, error correction bits, and spare bits associated with the memory locations being tracked using the histogram data structure 400.

In operation, when a single bit error is detected for a given bit location, the LFSR associated with the given bit location is incremented. Therefore, the value in the LFSRs of data structure 400 function as counters, wherein each LFSR holds a value representing a histogram entry representing the number of single-bit errors that have occurred for a given bit location.

In various embodiments, the histogram data structure 400 is interrogated to allow a mechanism to diagnose a failing bit. Commonly observed single-bit errors will be exposed by reading the LFSRs of histogram data structure 400 and examining the frequency of the errors. In various embodiments, using the count values in the LFSRs allows for informed decisions to be made about which failing bit to replace using a spare-bit insertion operation.

It would be understood that the embodiments of the histogram data structure 400 are not limited to using LFSRs as the mechanism for storing count values for the detected single-bit errors, and that any type of counter or memory device operable to store a value associated with the number of occurrences of a single-bit error could be used to store the count values included in histogram data structure 400.

Figure 5:
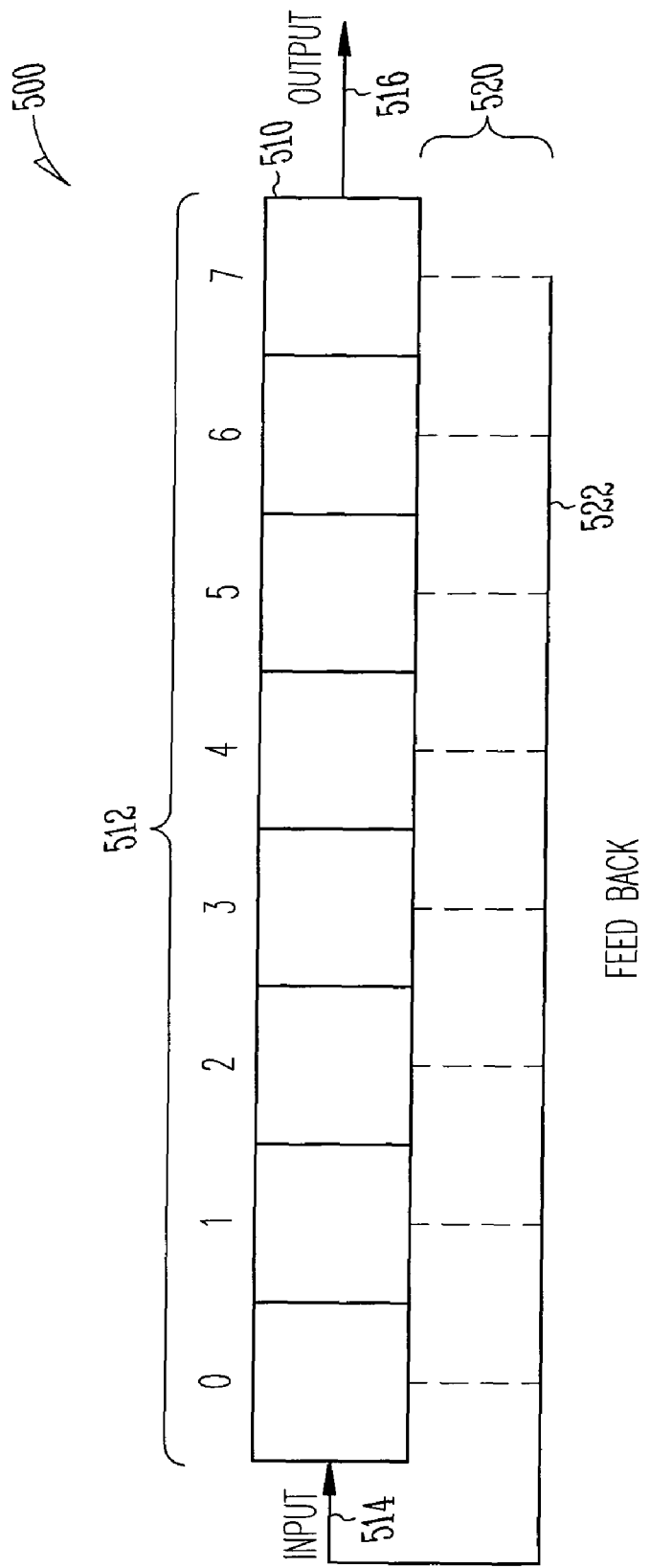
FIG. 5 shows a diagram illustrative of a linear feedback shift register.

FIG. 5 shows a diagram 500 illustrative of a linear feedback shift register 510. LFSR 510 includes eight bits 512, labeled 0 through 7. However, embodiments are not limited to LFSRs having 8 bits, and any number of bits may be used in the LFSR 510 as deemed appropriate for the values to be stored in the LFSR 510. LFSR 510 includes an input 514 and an output 516. Input 514 is operable to allow data to be shifted into the LFSR 510. Output 516 is operable to output the data bit from position 7 when a data bit is shifted into position 0. LFSR 510 includes feedback 522. Feedback 522 is coupled to one or more bits included in LFSR 510 through taps 520, and is coupled to input 514. The particular ones of taps 520 that are actually used in coupling LFSR 510 to feedback 522 provide the feedback function and determine the sequence of values stored in LFSR 510. By selecting the proper feedback function via the taps 520 used to couple LFSR 510 to feedback 522, LFSR 510 is made to function so as to add a value of 1 to the value present in the LFSR 510 each time the LFSR 510 is shifted. The particular taps 520 coupled to the feedback 522 can be referred to as the feedback polynomial. In various embodiments, the feedback polynomial for LFSR 510 is $x^6+x^3+x$.

In various embodiments, by providing the proper coupling of taps 520, LFSR 510 is made to operate as an "add by 1" incremental counter, and is operable to perform as any one of the LFSR in a histogram data structure, such as but not limited to the histogram data structure 400 of FIG. 4.

Figure 6:
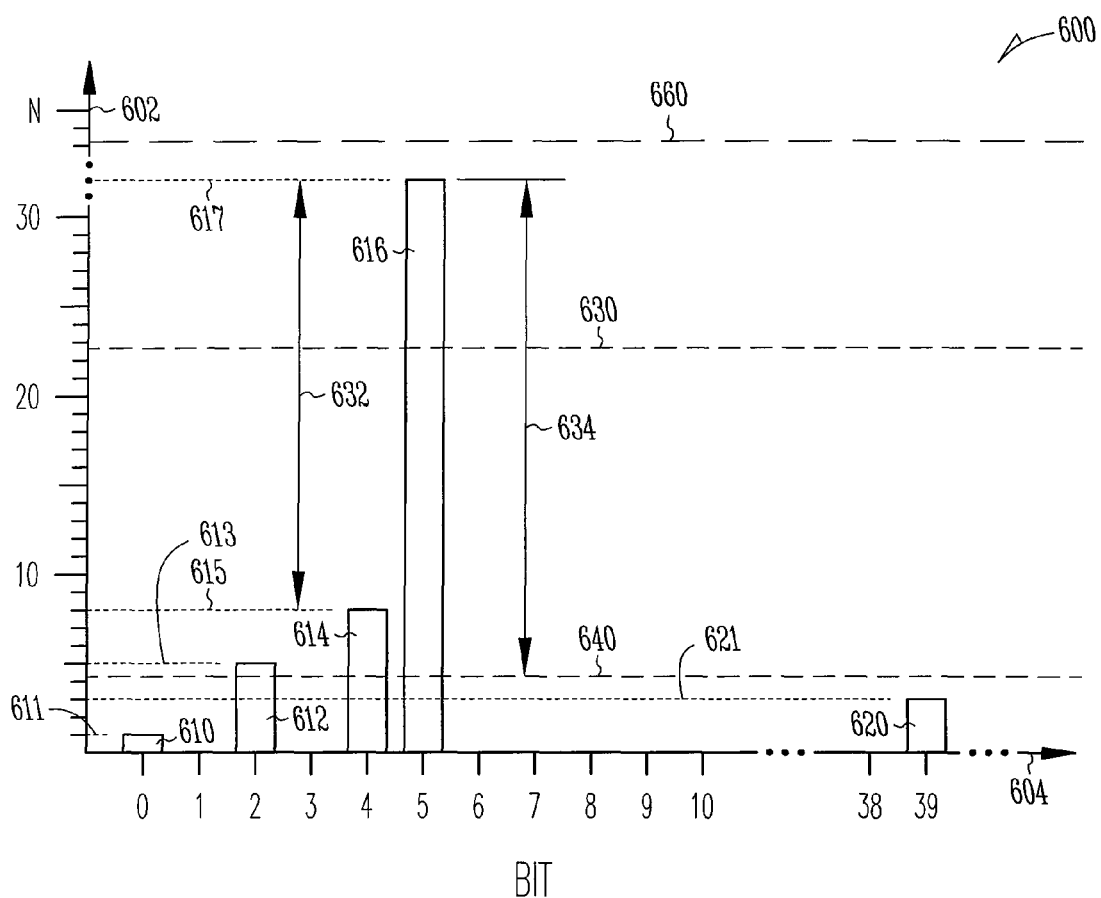
FIG. 6 shows an illustrative single bit error histogram.

FIG. 6 shows an illustrative single-bit error histogram 600. Single-bit error histogram 600 includes a vertical axis 602 and a horizontal axis 604. Vertical axis 602 represents a value corresponding to a value, such as 0 to N, that is capable of being stored in a single bit error counter. Horizontal axis 604 represents the bits, such as bits 0 through 39, that are including in the data stored in a given memory location or a set of memory locations.

For any given bit represented along horizontal axis 604, a histogram bar can be shown that represents the count value in a counter representative of the number of occurrences of single-bit errors for that particular bit. By way of illustration, histogram bar 610 has a height 611 representative of a count value indicative of the number of signal-bit errors that have occurred for bit 0 of the data associated with single-bit error histogram 600.

By way of further illustration: bar 612 has a height 613 representative of a count value indicative of the number of single-bit errors that have occurred for bit 2, bar 614 has a height 615 representative of a count value indicative of the number of single-bit errors that have occurred for bit 4, bar 616 has a height 617 representative of a count value indicative of the number of single-bit errors that have occurred for bit 5, and bar 620 has a height 621 representative of a count value indicative of the number of single-bit errors that have occurred for bit 39. It would be understood that a histogram bar exists for any of bits 0 through 39, although not all bits in the single-bit error histogram 600 are shown having a histogram bar. In various embodiments, one or more of bits 0 through 39 have a count value of zero associated with the number of occurrences of single-bit errors for the given bit.

In various embodiments, the height of histogram bar for any one of bits 0 through 39 is determined by polling the registers storing the count values for the number of occurrences single-bit error for each particular bit of bits 0-39. In various embodiments, single-bit error histogram 600 is used to determine which one, if any, of bits 0 through 39 are to have a spare-bit insertion operation performed when the data associated with single-bit error histogram 600 is accessed. By way of illustration, a threshold value, represented by line 630, is set. By comparing the heights of each of the histogram bars to line 630, a determination can be made that a particular bit has a height for its histogram bar that exceeds the value represented by line 630. By way of illustration, the height 617 of histogram bar 616 exceeds the value represented by line 630. In various embodiments, based on this determination, bit 5 in the data associates with single-bit error histogram 600 would be marked to have a spare-bit insertion operation performed when accessing the data. In various embodiments, the spare-bit insertion operation includes storing a value for each data word in the spare bit included in the data of each data word (for instance in bit 39 in each data word), and when the particular data word is accessed, performing a bit insertion operation to insert the bit stored in the spare bit location into the data word at bit 5. It would be understood that the bit value stored in the spare data bit could be inserted into any of the bits 0 though 38 that are determined to require a bit insertion.

The determination as to when a spare-bit insertion operation is to be applied when accessing data associated with single-bit error histogram 600 is not limited to any particular criteria. In various embodiments, a difference value 632 is determined between the histogram bar having the highest value (by way of illustration histogram bar 616) and the next highest value (histogram bar 614 by way of illustration) and if the difference value 632 exceeds a given threshold value, the bit having the highest histogram bar value is marked for a bit insertion operation whenever the data is accessed. In various embodiments, a value 640 representative of a mean height for all of the bits except the bit having the highest histogram bar value is determined, and the difference value 634 between the value of the histogram bar having the highest value and the mean value 640 exceeds a threshold value, the bit having the highest histogram bar value is marked for a bit insertion operation to be performed whenever the data is accessed. In various embodiments, marking data for spare-bit insertion includes generating a spare bit mask for the data on which the spare-bit insertion operation is to be performed.

In various embodiments, each of the counters storing the values representative of the number of occurrences of single-bit errors for a particular bit are saturation counters. Saturation counts are counters that will increment up in value to a maximum value, but will not increment to value that will cause the counter to roll-over and have a value that is now less then a value that was stored in the counter before incrementing was performed. In various embodiments, a saturation counter will only increment up to a given maximum value, and further attempts to increment the saturation counter will not result in a roll-over of the value stored in the counter. Once the maximum value for a saturation counter is reached, further attempts to increment the counter will not change the value stored in the counter until the saturation counter is reset. In various embodiments, line 660 represents a maximum value any of the counters used to store the value for the bits error represented in FIG. 6 can reach. Once any a given one of the saturation counters storing the values as represented in FIG. 6 reaches the maximum value represented by line 660, further occurrences of bit errors resulting in attempts to increment the given counter will not cause the saturation counter to increment, and will not cause the given counter to roll-over, wherein a rollover would result in a false low value for the counter and for the representation of the counter values in histogram 600.

Figure 7:
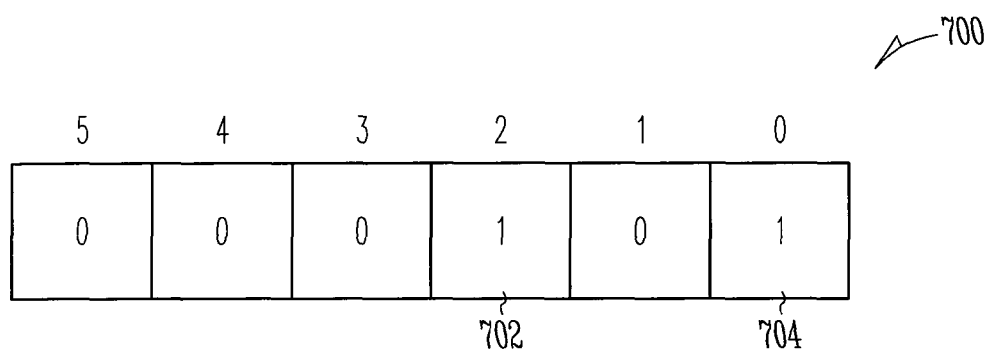
FIG. 7 shows an illustrative spare bit mask.

FIG. 7 shows an illustrative spare bit mask 700. Spare bit mask 700 includes a plurality of bits 712 labeled bits 0 through 5. In various embodiments, spare bit mask 700 corresponds to the data stored at a given set of memory locations. In various embodiments, spare bit mask 700 includes a bit value indicative of the particular bit position within the plurality of bit potions in the memory locations associate with the designated "bad" bit position for a designed group of memory locations. By way of illustration, bit 0 and bit 2 in the plurality of bits 712 have a value of "1" and bits 1 and 3-5 have a value of "0." When read as a binary number, spare bit mask has a stored value of binary "000101" or decimal "5". In various embodiments, this value in spare bit mask 700 indicates that bit position 5 is the designated "bad" bit position, when a spare-bit insertion operations is performed using spare-bit mask 700, bit position 5 is not to be used for storing data at the memory locations spare bit mask 700.

It would be understood that other forms of spare bit masks could be utilized to determine where the data in the spare bit is to be inserted within the data bits of a memory location. Various embodiments include spare bit masks that have a one-to-one bit correspondence with the number of bits in the memory location or memory locations that are associated with the spare bit mask, and wherein a single different value for a bit, such as a single "1" is stored in the mask at a bit position in the spare bit mask that corresponds to the "bad" bit position in the memory location where the spare-bit insertion is to occur.

In various embodiments, a plurality of spare bit masks are generated to indicate where the "bad" spare-bit insertions are to take place, wherein each of the plurality of spare bits masks corresponds to the data at a given memory location, or to the data at a given plurality of memory locations. By way of illustration, a given plurality of memory locations are grouped together for some reason, such as the group of memory locations are designated an addressable page of memory, or in some embodiments are all accessed using a common column line used to read the data from the memory locations.

FIG. 8 shows an illustrative diagram 800 of a spare-bit insertion register 810. In various embodiments, spare-bit insertion register 810 includes memory address locations 821 and 831, and spare-bit insertion pointer 822. In various embodiments, spare-bit insertion register 810 includes a first section 820 and a second section 830. In various embodiments, first section 820 includes one or more mapping registers 821 representing memory locations that, during a given spare-bit insertion scrubbing operation, have been scrubbed, and a second section 830 including one or more mapping registers 831 represent memory locations that, during the given spare-bit insertion scrubbing operation, have not yet been scrubbed. Pointer 822 represents the boundary between the first section 821 and the sections section 830. Pointer 822 is operable to be reset to the first of registers 821 at the initiation of a spare-bit insertion scrubbing operation. As the spare-bit insertion scrubbing operation proceeds, the position of pointer 822 moves down through the spare-bit insertion register, register by register, to track and separate the memory locations indicted by the first register 821 that have been scrubbed from the memory locations included in the second registers 831 that have not been scrubbed. In various embodiments, when pointer 822 reaches register 831 indict the that all the memory locations represented in spare-bit insertion register 810 have been scrubbed, the spare-bit scrubbing operation has been completed.

Figure 9:
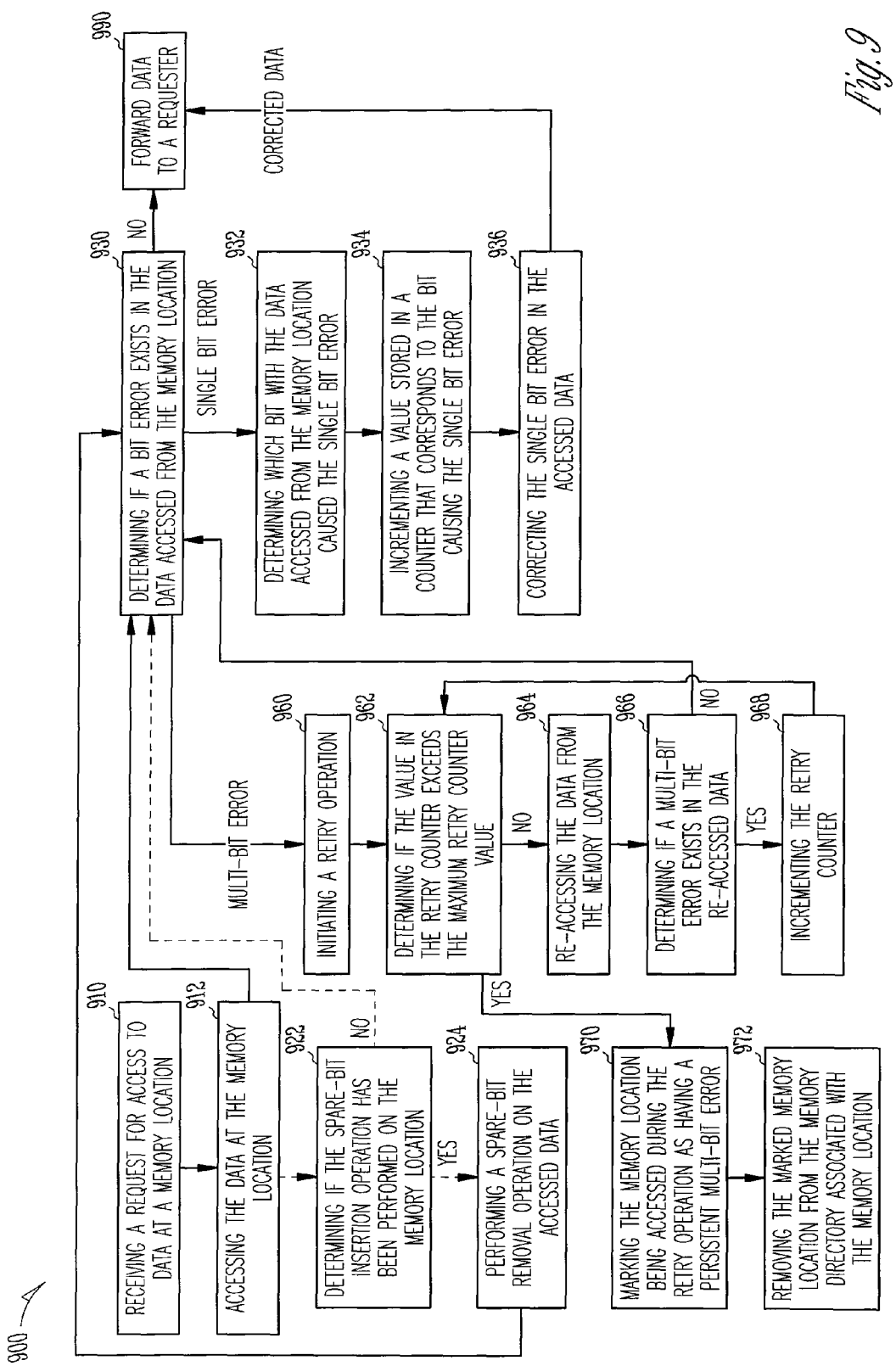
FIG. 9 shows a flowchart for various methods according to various embodiments.

FIG. 9 is a flowchart for a method 900 according to various embodiments.

At block 910, method 900 includes receiving a request for access to data at a memory location. In various embodiments, the request for access includes requesting data be read from a memory location. In various embodiments, the request for access includes accessing the memory location as part of a memory scrubbing operation.

At block 920, method 900 includes accessing the data at the memory location. In various embodiments, accessing the data includes accessing data at a memory location. In various embodiments, accessing the data includes accessing data at a plurality of memory locations.

In various embodiments, method 900 includes after accessing the data at the block 920, proceeding to block 922. Block 922 includes determining if the spare-bit insertion operation has been performed on the memory location where the data was accessed. In various embodiments, determining if the spare-bit insertion operation has been performed includes determining that the spare-bit insertion operation has been activated for the memory location, and also the spare-bit scrubbing process has been completed for the memory location. If it is determined at block 922 that the spare-bit insertion operation has not been performed on the memory location, method 900 continues at block 930. If a determination is made at block 922 that the spare-bit insertion process has been performed on the memory location, method 900 proceed from block 922 to block 924. At block 924, method 900 includes performing a spare-bit removal process on the accessed data to restore the accessed data. Once the accessed data is restored at block 924, method 900 proceeds to block 930.

At block 930 method 900 includes determining if an error exists in the data accessed from the memory location. In various embodiments, determining if an error exists includes determining that no bit errors exist in the data. In various embodiments, no bit errors includes no single-bit errors and no multiple bit errors being present in the data accessed from the memory location. In various embodiments, determining if an error exists in the data accessed from the memory location includes parsing bits comprising an error correction code from the accessed data, and using the error correction code to determine if a single bit error, or if a multi-bit error, exists in the data bits included in the accessed data. In various embodiments, when no bit errors are found in the data accessed from the memory location, method 900 proceeds to block 990, including forwarding the data to a requestor. In various embodiments, the requestor is the entity providing the received request for access to the data at the memory location. In various embodiments, the requestor is a processor. In various embodiments, the requester is a scrub engine. In the instance wherein the data did not include any bit errors, the data that is forwarded to the request is the same data as was accessed at the memory location.

If an error is detected, method 900 includes at block 930 determining if the bit error is a single-bit error or a multiple bit error. If the error is a single-bit error, method 900 proceeds to block 932. Block 932 includes determining which bit within the data accessed from the memory location caused the single bit error. Once the bit responsible for causing single-bit error has been determined, method 900 proceeds to block 934.

At block 934, method 900 includes incrementing a value stored in a counter that corresponds to the bit position in the data that caused the single bit error. Once the value stored in the counter has been incremented, method 900 proceeds to block 936.

At block 936, method 900 includes correcting the single bit error in the accessed data to generate corrected data. Method 900 then proceeds to block 990, including forwarding data to the requester. In such instances including generating corrected data, the data forwarded to the requester is the corrected data generated at block 936.

Again referring to block 930, if a determination is made at block 930 that a multiple bit error exists in accessed data from block 920, or in data provided by block 924, method 900 proceeds to block 960.

At block 960, method 900 includes initiating a retry operation. In various embodiments, initiating a retry operation including initializing a value in a retry counter to an initial value, such as a value of zero. After initializing the retry operation, method 900 proceeds to block 962.

At block 962, method 900 includes determining if the value in the retry counter exceeds the maximum retry counter value. In various embodiments, the maximum retry counter value is a predetermined value set to determine a maximum number of retries that are allowed for a given retry operation, wherein a retry includes accessing the data at a memory location when the data originally accessed from the memory location included a multi-bit error. In various embodiments, the number chosen of the maximum retry counter value is set by a system administration. In various embodiments, the value chosen for the maximum retry counter value is a positive integer. In various embodiments, the maximum retry counter value is set to a value of one, wherein only one re-try operation including re-accessing the data stored in the accessed memory location having the multi-bit error in the accessed data will be performed as part to the retry operation.

If the value of the retry counter does not exceed the maximum retry counter value, method 900 proceeds to block 964. Block 964 includes re-accessing the data at the memory location originally accessed in block 920. In various embodiments, re-accessing the data includes determined if a spare-bit insertion operation has been applied to the memory location, and if so, performing a spare bit removal operation on the data re-accessed from the memory location to restore the data before further processing of the re-accessed data.

After re-accessing the data at block 964, method 900 proceeds to block 966, which includes determining if a multi-bit error exists in the re-accessed data. If the re-accessed data does not include a multi-bit error, the re-accessed data is provided to block 930 for further processing, and the retry operation is terminated. In various embodiments, this includes proceeding to block 930 from block 966 when only a single-bit error is present in the re-accessed data, or when no bit errors are present in the re-accessed data.

Referring again to block 966, if a multi-bit error is including in the re-accessed data, method 900 proceeds to block 968, which includes incrementing the value in the retry counter, for example by one. After incrementing the counter at block 986, method 900 proceeds to block 962 to again determine if the newly incremented value in the retry counter exceeds the maximum retry counter value. If not, the retry operation continues with another re-accessing of the data at the memory location, and another determination as to whether this latest re-accessed data includes a multi-bit error. The latest re-accessed data is processed by block 966 in a same manner as described for the previously accessed data for block 966. This process of re-accessing, determining if multi-bit errors exist in the latest re-accessed data, and incrementing the retry counter if multi-bit errors exists in the latest accessed data is repeated until either the accessed data does not include a multi-bit error, or the value in the retry counter equals or exceeds the maximum retry counter value. In each of these re-accessing processes, if spare-bit insertion having been performed on the memory location being accessed, the spare bit removal operation is performed before any evaluation is made on the re-accessed data as to whether the re-accessed data includes a multi-bit error. If the value in the retry counter exceeds the maximum retry counter value, method 900 proceeds to block 970.

If the retry counter value is determined to be equal or exceeds the maximum counter value, method 900 proceeds to block 970. At block 970, method 900 includes marking the memory location being accessed during the retry operation as having a persistent multi-bit error, and terminating the retry operation. In various embodiments, the failing address that includes the persistent multi-bit error is captured by hardware MMRs. Software, such as the maintenance software, can interrogate these MMRs and map out the page which has the persistent multi-bit error. In various embodiments, the software provides an error message indicative that a replacement of the memory device that includes the memory location having the persistent multi-bit error should be physically replaced. In various embodiments, after terminating the re-try process at block 970, method 900 proceeds to block 972, which in some embodiments includes removing the marked memory location from the memory directory associated with the memory location. In various embodiments, when a memory location is determined to have a persistent multi-bit error, the node that includes the memory location having the persistent multi-bit error is removed from the system using software until some tome later when the memory device including the node can be replaced.

Figure 10:
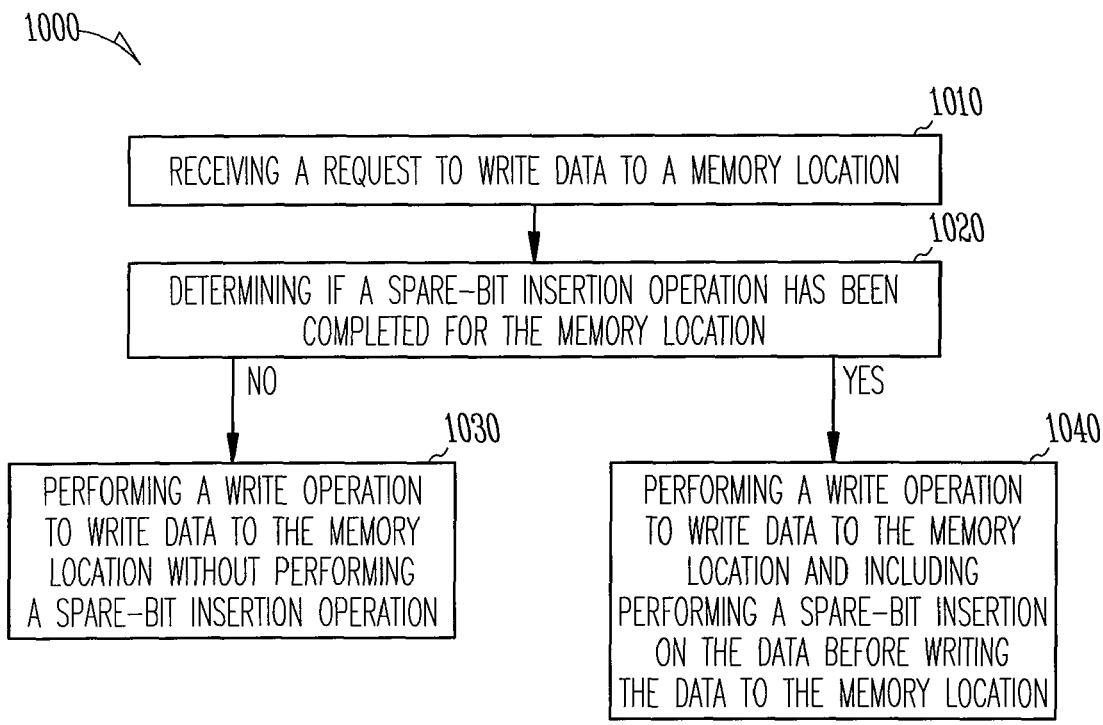
FIG. 10 shows a flowchart for various methods according to various embodiments.

FIG. 10 shows a flowchart for a method 1000 according to various embodiments. At block 1010, method 1000 includes receiving a request to write data to a memory location. In various embodiments, the request to write data to a memory location includes a request generated as part of a scrubbing operation of a memory device where the memory location exists.

At block 1020, method 1000 includes determining of a spare-bit insertion operation has been completed for the memory location. In various embodiments, determining if a spare-bit insertion operation has been completed includes both determining if a spare-bit insertion operation has been activated for the memory location, and if the spare-bit insertion scrubbing operation has been competed for the memory location.

In various embodiments, if a spare-bit insertion operation has not been completed for the memory location, method 1000 proceeds to block 1030. At block 1030, method 1000 includes performing a write operation to write data to the memory location without performing a spare-bit insertion operation. In various embodiments, writing the data without performing the spare-bit insertion operation including using a non-spare-bit insertion mask to determine the ordering of the bits in the data with respect to the placement of the bits into the bit storage locations within the memory location.

In various embodiments, if a spare-bit insertion operation has been completed for the memory location, method 1000 proceed to block 1040. At block 1040, method 1000 includes performing a write operation to write data to the memory location and including performing a spare-bit insertion on the data before writing the data to the memory location. In various embodiments, performing the spare-bit insertion operation on the data includes using a spare-bit insertion mask to determine the order and arrangement of the bits in the data with respect to the ordering and arrangement of the bits in the storage location. In various embodiments, the spare-bit insertion mask is designated to leave all bits in the data that are located in bit positions less significant than a designated bad bit position in a same bit position in the stored data, and to shift each of the bits in the data that are located at the "bad" bit position and in bit positions that are more significant then the designated bad bit position up by one bit position so that at a spare bit in the memory location stores the most significant bit in data after the data is stored in the memory location, and where no data bits from the original data are stored in the "bad" bit position in the memory location.

Figure 11:
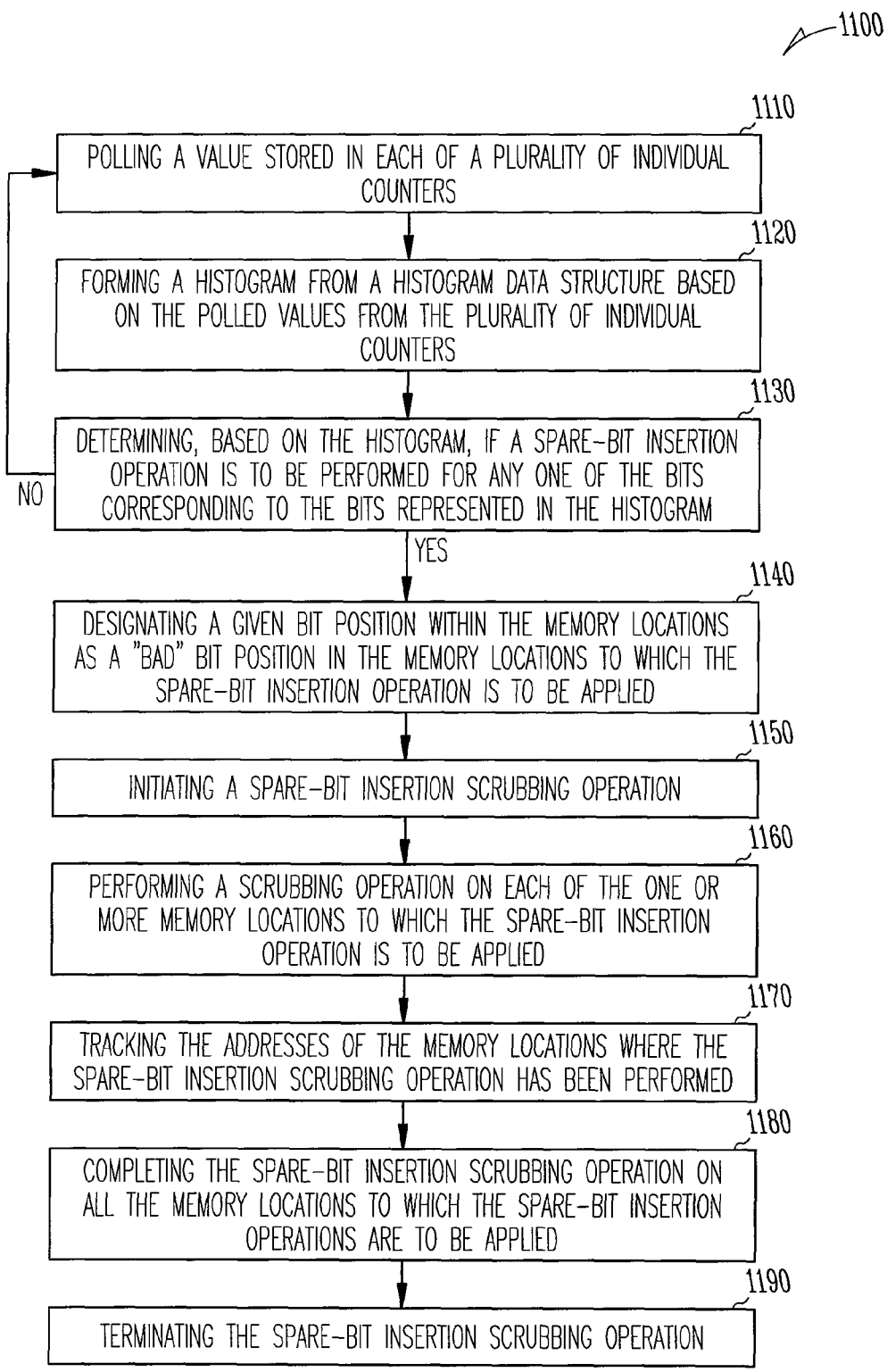
FIG. 11 shows a flowchart for various methods according to various embodiments described herein.

FIG. 11 is a flowchart for a method 1100 according to various embodiments.

At block 1110, method 1100 includes polling a value stored in each of a plurality of individual counters. In various embodiments, each of the values represents a count indicative of the number of occurrences of a single-bit error that has occurred for a given one of a plurality of bits as a result of accessing the data stored at a memory location within a memory device. In various embodiments, the given memory location includes a plurality of memory locations. In various embodiments, the individual counters are linear feedback shift registers. In various embodiments, the individual counters are saturation counters. In various embodiments, the individual counters are both linear feedback shift registers and saturation counters.

At block 1120, method 1100 includes forming a histogram from a histogram data structure based on the polled values from the plurality of individual counters. In various embodiments, forming the histogram includes, for each of the given bits, forming a bar having a height indicative of the value store in the individual counter corresponding to the number of occurrences of single-bit errors for the given bit.

At block 1130, method 1100 includes determining, based on the histogram, if a spare-bit insertion operation is to applied to one or more of the memory locations of the memory device corresponding to the bits represented in the histogram. In various embodiments, determining if the spare-bit insertion operation is t be performed includes determining if any of the polled values exceeds a pre-determined threshold value. In various embodiments, the pre-determined threshold value is a value determined by a system administrator, and is stored with the histogram data structure. A system administrator includes any person or entity that has authority to set and oversee operating parameters for the memory system that is associated with the histogram data structure. In various embodiments, determining that any of the polled values exceeds the pre-determined threshold value includes determining if any given height of the histogram bars for any of the bits exceeds a height of a line indicative of the pre-determined threshold value.

If a determination is made at block 1130 that a spare-bit insertion operation is not to be applied, method 1100 returns to block 1110. If a determination is made at block 1130 that a spare-bit insertion operation is to be applied to one or more memory locations of the memory device, method 1100 proceed to block 1140.

At block 1140, method 1100 includes designating a given bit position within the memory locations as a "bad" bit position in the memory locations to which the spare-bit insertion operation is to be applied. In various embodiments, the memory locations to which the spare-bit insertion operation is to be applied includes all of the memory locations included in a given memory device. In various embodiments, the "bad" bit position triggering activation of a spare-bit insertion operation is determined when a polled value from the histogram data structure corresponding to the given bad bit exceeds the pre-determined threshold value. In various embodiments, marking a given bit includes generating and storing a spare-bit insertion mask for use during the spare-bit insertion operations, wherein the spare bit mask includes an indication of the bad bit position.

At block 1150, method 1100 includes initiating a spare-bit insertion scrubbing operation.

At block 1160, method 1100 includes performing a scrubbing operation on each of the one or more memory locations to which the spare-bit insertion operation is to be applied. In various embodiments, performing a spare-bit insertion scrubbing operation includes setting a value in a memory management register indicative that the spare-bit insertion operation has been activated, sequentially performing a read-modify-write operations on each of the memory locations on which the spare-bit insertion operation is to be performed. In various embodiments, the read-modify-write process includes reading the data from a memory location using a non-spare-bit insertion mask, determining that no bit errors exist in the data, and then writing the data back to the memory location using a spare-bit insertion mask.

In various embodiments, masking a given bit includes mapping the memory location on which the spare-bit insertion operation is to be performed into a memory register that includes mappings to the addressable memory locations on which any spare-bit insertion operations are to be performed.

At block 1170, method 1100 includes during the spare-bit insertion scrubbing operation, tracking the addresses of the memory locations where the spare-bit insertion scrubbing operation has been performed. In various embodiments, tracking the progress of the read-modify-write operation includes using a pointer value to identify which memory addresses have and have not been operated on by the read-modify-write process.

At block 1180, method 1100 completing the spare-bit scrubbing operation an all the memory locations to which the spare-bit insertion operations are to be applied. In various embodiments, completing the spare-bit scrubbing operation includes setting a value in another register in the memory manager registers when the process has been completed on all the memory locations to which the spare-bit insertion operation is to be applied.

At block 1190, terminating the spare-bit insertion scrubbing operation.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the example embodiments of the subject matter described herein. It is intended that this subject matter be limited only by the claims, and the full scope of equivalents thereof.

Various embodiments include an apparatus comprising a memory device including a plurality of addressable memory locations, and a memory manager coupled to the memory device, the memory manager including a scheduling unit and a histogram data structure including a plurality of counters, the scheduling unit operable to detect a single-bit error in data read from the memory device, and to increment a value in a particular one of the plurality of counters, the particular one of the plurality of counters corresponding to the particular bit in the accessed data which incurred the single-bit error in the read data.

Various embodiments include a histogram data structure stored in a memory device of a memory manager and coupled to a memory device including a plurality of addressable memory locations comprising a plurality of linear feedback shift registers, wherein each of the linear feedback shift registers are operable to store a value corresponding to one and only one bit within a plurality of bits included in each of the plurality of addressable memory locations, the value indicative of the number of single-bit errors that occurred for the same one and only one bit.

Various embodiments include a method comprising receiving a request for access to data at a memory location, accessing the data at the memory location, determining if a bit error exists in the data accessed from the memory location, if no bit error exists in the data, forwarding the data on to a requester, and if a single-bit error exists in the data, determining which bit within the accessed data caused the single-bit error, incrementing a counter storing a value corresponding to the bit causing the single-bit error, correcting the single-bit error in the accessed data to generate corrected data, and then forwarding the corrected data on to the requester.

Various embodiments include a method of determining when a spare-bit insertion operation is to be performed on data accessed from a memory location comprising polling the values stored in a plurality of counters, wherein each of the values represents a count indicative of the number of occurrences of a single-bit error that has occurred for a given one of a plurality of bits as a result of accessing of the data stored at the memory location, generating a histogram using the polled values, determining, based on the histogram, if a spare-bit insertion operation is to be performed for any one of the bits corresponding to the bits represented in the histogram.

Such embodiments of the subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. An apparatus comprising:
    a memory device including a plurality of addressable memory locations; and
    a memory manager coupled to the memory device, the memory manager including a scheduling unit and a histogram data structure including a plurality of counters, the scheduling unit operable to detect a single-bit error in data read from the memory device, and to increment a value in a particular one of the plurality of counters, the particular one of the plurality of counters corresponding to the particular bit in the accessed data which incurred the single-bit error in the read data;
    wherein one of the counters comprises an 8-bit counter described by a linear feedback shift register with a polynomial $x^6+x^3+x$.

2. The apparatus of clam 1, wherein each of the plurality of counters is an 8-bit saturation counter.

3. The apparatus of claim 1, wherein each of the plurality of counters is a linear feedback shift register (LFSR) that includes an input, a plurality of taps coupled to a feedback loop, wherein the feedback loop is coupled to the input.

4. The apparatus of claim 3, wherein each of the linear feedback shift registers includes 8 bits.

5. The apparatus of claim 1, wherein the histogram data structure includes a plurality of linear shift registers having a feedback polynomial function operable to cause each of the linear shift registers to operate as an add by 1 incremental counter.

6. The apparatus of claim 1, wherein each of the plurality of counters is a saturation counter having a maximum value representing the value the saturation counter can be incremented to and to which the counter value of the saturation counter can not be incremented past to cause a roll-over of the value stored in the saturation counter.

7. The apparatus of claim 1, further including a maintenance system coupled to the memory manager, wherein the maintenance system is operable to poll the histogram data structure, and to determine if any of a set of count values included in the histogram data structure exceeds a predetermined threshold value, wherein each of the count values representative of the number of occurrences of a single-bit error for given bit in a memory location associated with the histogram data structure.

8. The apparatus of claim 7, wherein if a determination is made that a given one of the count values exceeds the predetermined threshold values, a bit in the memory location associated with the histogram data structure and corresponding to the count value that has exceeded the predetermined threshold value, the memory manager is operable to mark the bit for a spare-bit insertion operation to be performed when accessing the memory location.

9. The apparatus of claim 7, further including a spare bit mask stored in the maintenance system, the spare bit mask storing a value indicative of which given bit of a plurality of bits in a memory location associated with the spare bit mask is to have data from a spare bit inserted in to the given bit when the memory location is accessed.

10. A histogram data structure stored in a memory device of a memory manager and coupled to a memory device including a plurality of addressable memory locations comprising:
    a plurality of linear feedback shift registers, wherein each of the linear feedback shift registers are operable to store a value corresponding to one and only one bit within a plurality of bits included in each of the plurality of addressable memory locations, the value indicative of the number of single-bit errors that occurred for the same one and only one bit, wherein a feedback polynomial for the linear feedback shift register is $x^6+x^3+x$.

11. The histogram data structure of claim 10, wherein each of the linear feedback shift registers includes at least one tap coupled to a feedback loop and coupled through the feedback loop to an input to the linear feedback shift register.

12. The histogram data structure of claim 10, including:
a predetermined threshold value including a value that when exceeded by a value corresponding to any one of the values in the linear feedback shift registers, indicates that a spare-bit insertion operation is to be performed for a given bit of the plurality of bits, the given bit corresponding to the linear feedback shift register having a value exceeding the predetermined threshold value.

13. The histogram data structure of claim 10, including:
a maximum value including a value that is the maximum count that any one of the linear feedback shift register can be incremented up to.

* * * * *